(12) United States Patent
Nosaka

(10) Patent No.: US 10,686,421 B2
(45) Date of Patent: Jun. 16, 2020

(54) RADIO FREQUENCY FRONT END CIRCUIT AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/356,322

(22) Filed: Mar. 18, 2019

(65) Prior Publication Data

US 2019/0214959 A1 Jul. 11, 2019

Related U.S. Application Data

(63) Continuation of application No. PCT/JP2017/033141, filed on Sep. 13, 2017.

(30) Foreign Application Priority Data

Sep. 27, 2016 (JP) ................................. 2016-188769

(51) Int. Cl.
*H03H 1/00* (2006.01)
*H04B 1/401* (2015.01)
(Continued)

(52) U.S. Cl.
CPC ............. *H03H 1/0007* (2013.01); *H04B 1/00* (2013.01); *H04B 1/006* (2013.01); *H04B 1/0057* (2013.01);
(Continued)

(58) Field of Classification Search
CPC .............................. H03H 1/007; H04B 1/0057
See application file for complete search history.

(56) References Cited

U.S. PATENT DOCUMENTS

| 5,768,691 A | 6/1998 | Matero et al. |
| 2011/0039504 A1* | 2/2011 | Nguyen ................... H03H 7/40 455/78 |

(Continued)

FOREIGN PATENT DOCUMENTS

| JP | H10-93473 A | 4/1998 |
| JP | 2011-41291 A | 2/2011 |

(Continued)

OTHER PUBLICATIONS

International Search Report for International Application No. PCT/JP2017/033141, dated Dec. 19, 2017.

(Continued)

*Primary Examiner* — Tuan H Nguyen
(74) *Attorney, Agent, or Firm* — Pearne & Gordon LLP

(57) ABSTRACT

A radio frequency front end circuit includes a switch circuit, duplexers, and a capacitor. The switch circuit includes a main switch that switches connection between a common terminal and a selection terminal, a sub-switch that switches connection between the selection terminal and the ground according to exclusive ON and OFF relative to the main switch, a main switch that switches connection between the common terminal and a selection terminal, and a sub-switch that switches connection between the selection terminal and the ground according to exclusive ON and OFF relative to the main switch. The switch circuit is switched between a first connection form in which only one of the main switches is ON and a second connection form in which both the main switches are ON. The capacitor allows connection between the selection terminal and the selection terminal.

20 Claims, 19 Drawing Sheets

(51) Int. Cl.
*H04B 1/00* (2006.01)
*H04B 1/04* (2006.01)
*H04B 1/52* (2015.01)
*H04B 1/18* (2006.01)

(52) U.S. Cl.
CPC ............ *H04B 1/0458* (2013.01); *H04B 1/18* (2013.01); *H04B 1/401* (2013.01); *H04B 1/52* (2013.01)

(56) References Cited

U.S. PATENT DOCUMENTS

| | | | |
|---|---|---|---|
| 2011/0260806 A1* | 10/2011 | Takeuchi | H03H 7/38 |
| | | | 333/103 |
| 2013/0273861 A1 | 10/2013 | See | |
| 2014/0167877 A1 | 6/2014 | Shimizu et al. | |
| 2015/0028963 A1 | 1/2015 | Ebihara et al. | |

FOREIGN PATENT DOCUMENTS

| | | |
|---|---|---|
| JP | 2015-29233 A | 2/2015 |
| JP | 2015-514381 A | 5/2015 |
| JP | 2015-154136 A | 8/2015 |
| WO | 2010/053131 A1 | 5/2010 |
| WO | 2013/021626 A1 | 2/2013 |

OTHER PUBLICATIONS

Written Opinion for International Application No. PCT/JP2017/033141, dated Dec. 19, 2017.

* cited by examiner

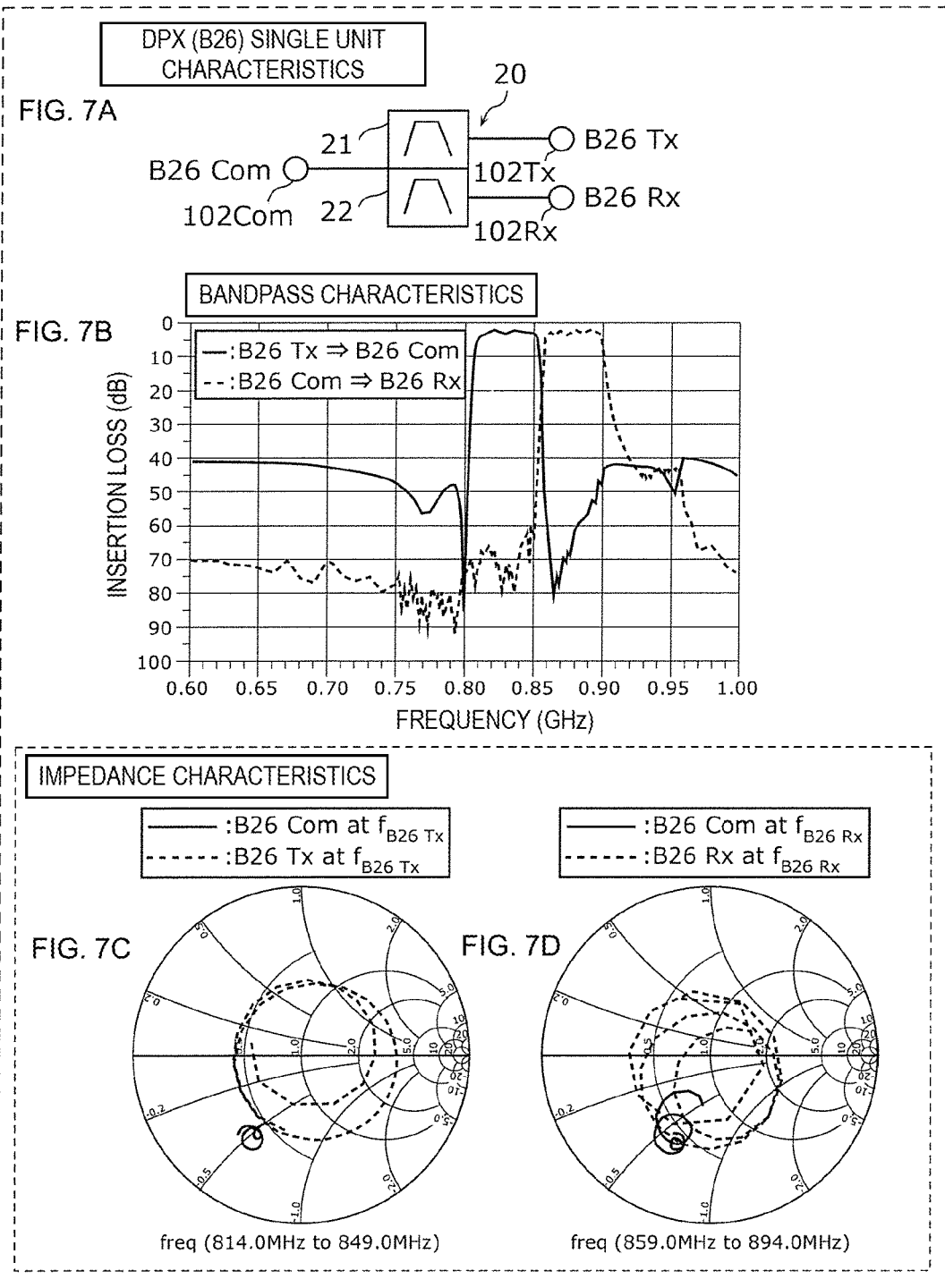

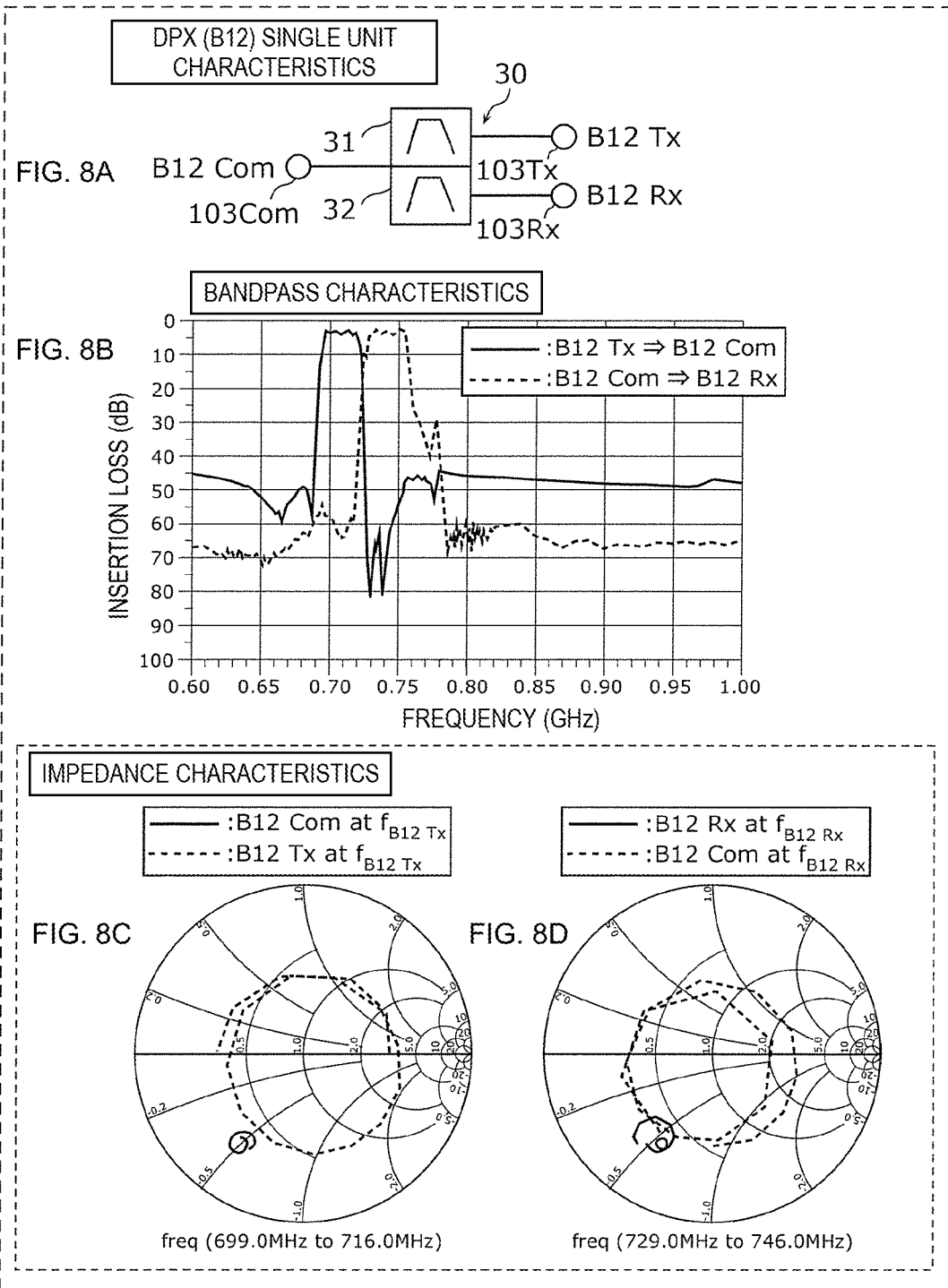

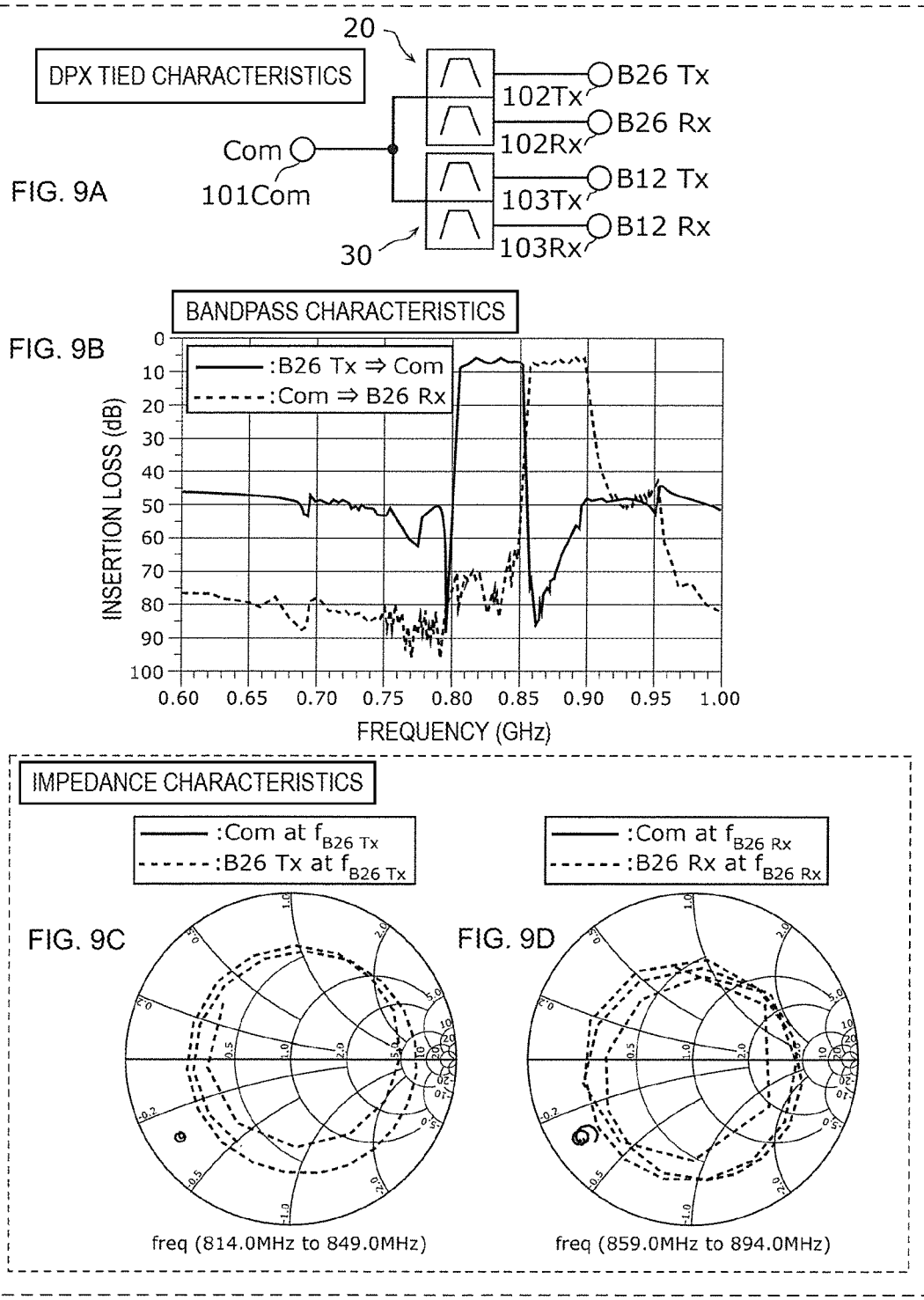

freq (699.0MHz to 716.0MHz)

freq (729.0MHz to 746.0MHz)

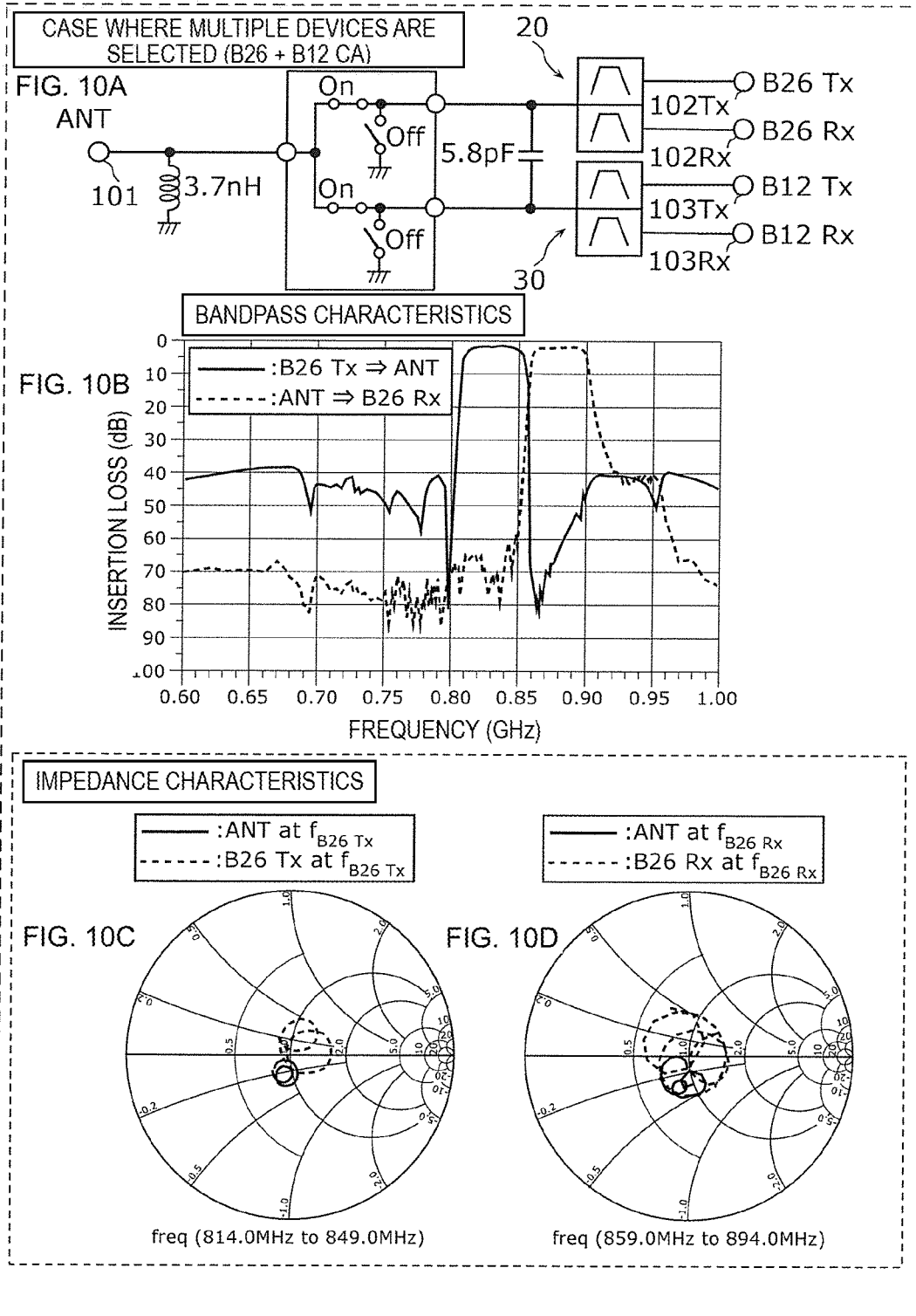

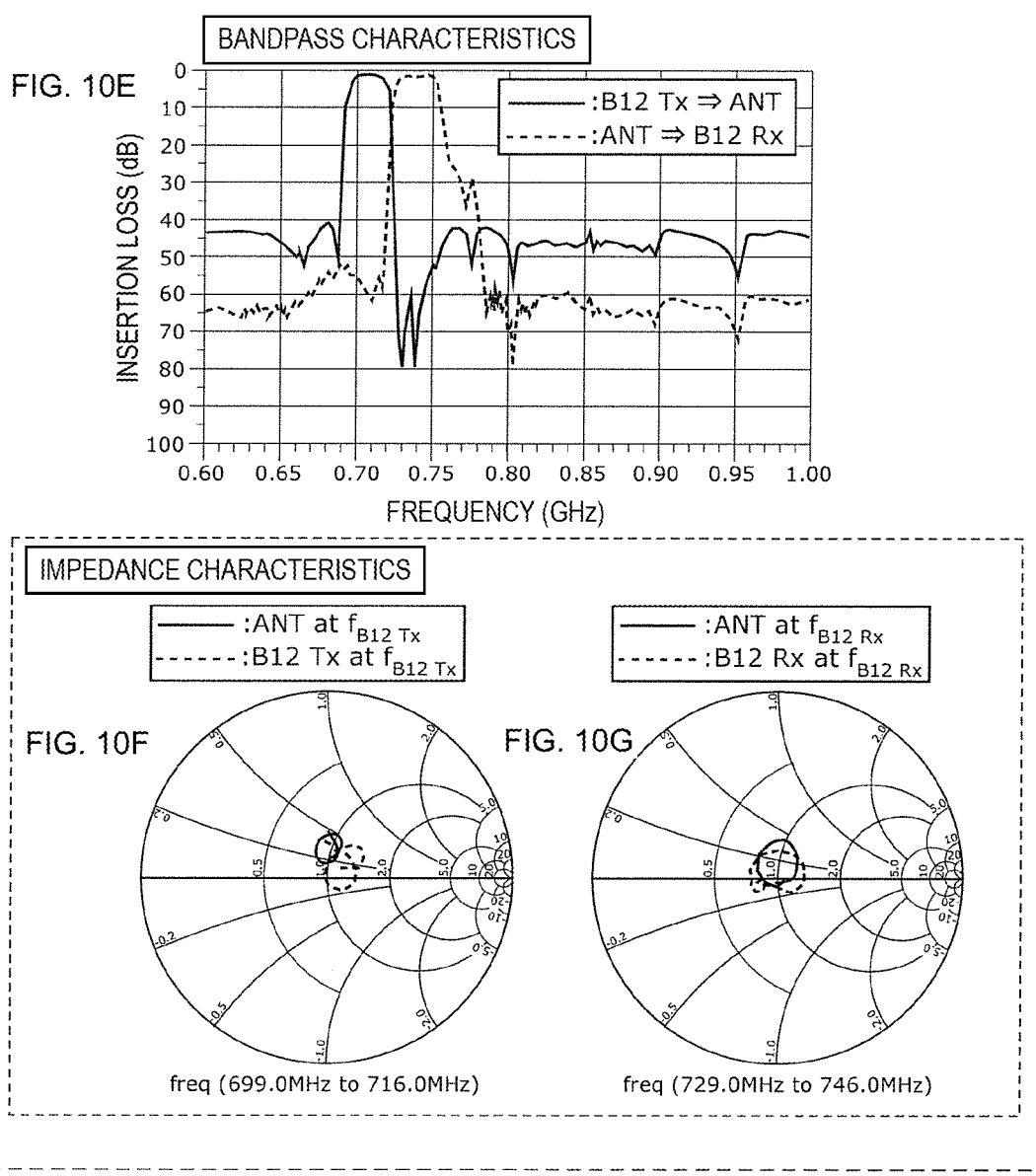

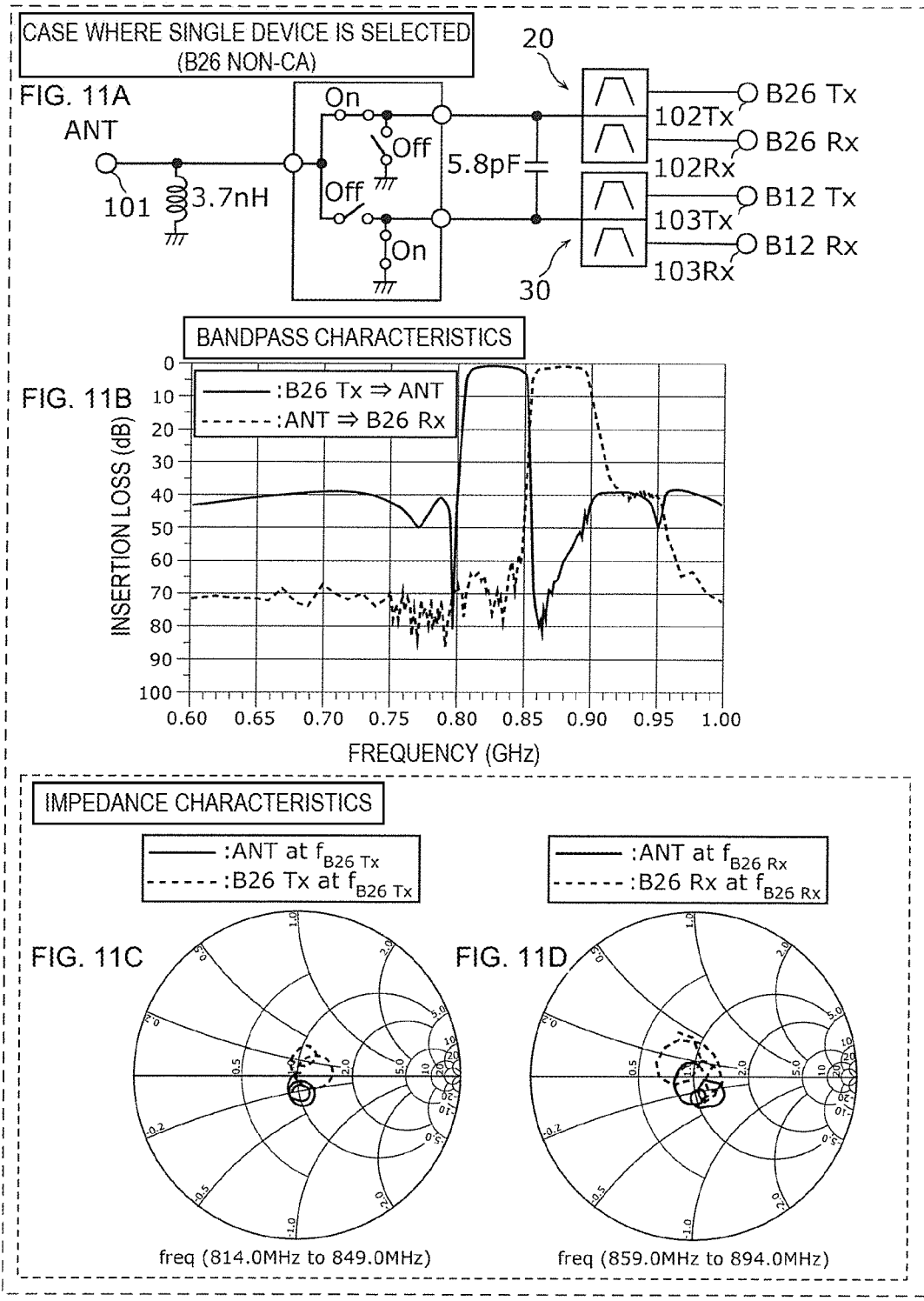

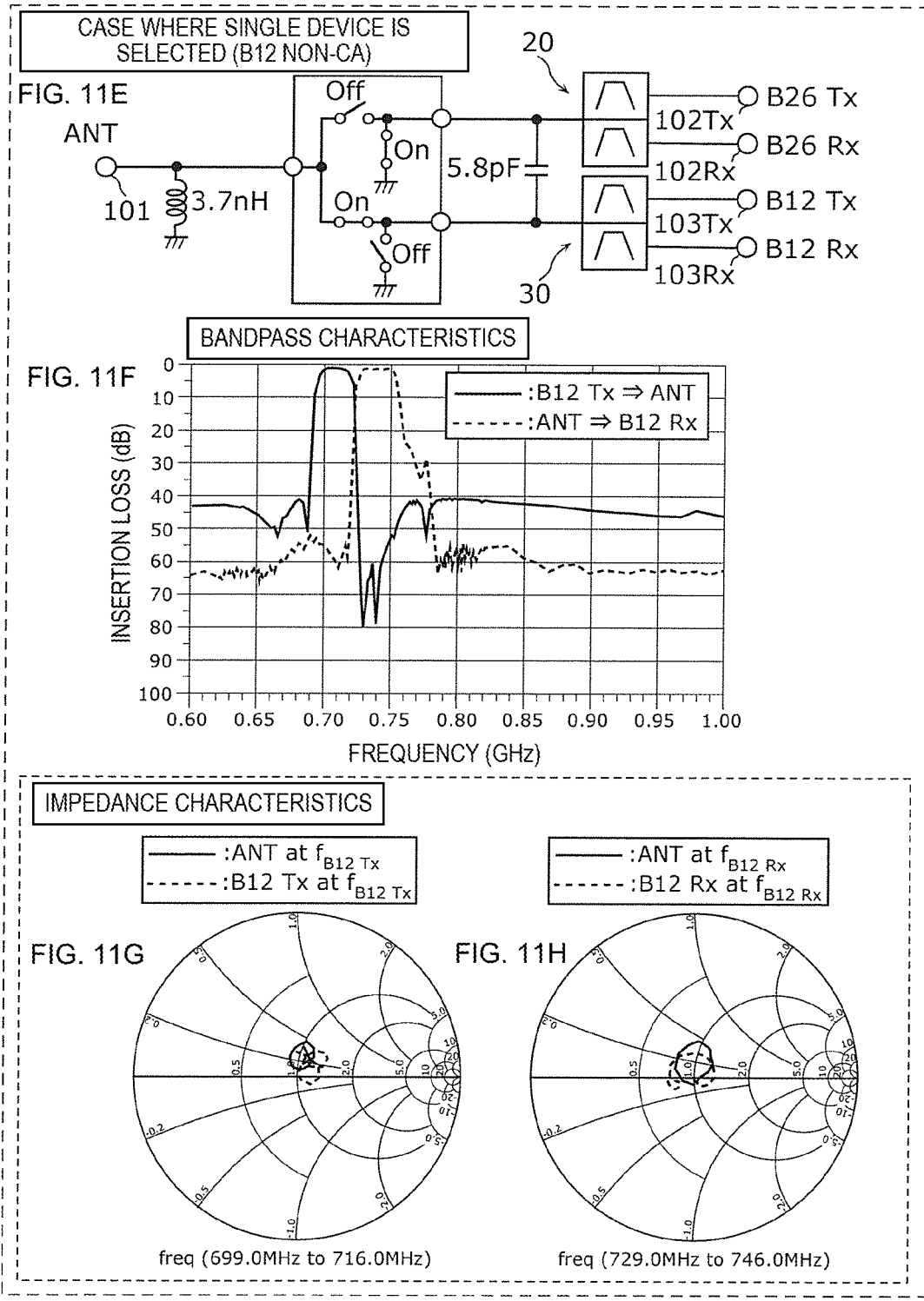

RADIO FREQUENCY FRONT END CIRCUIT AND COMMUNICATION APPARATUS

This is a continuation of International Application No. PCT/JP2017/033141 filed on Sep. 13, 2017 which claims priority from Japanese Patent Application No. 2016-188769 filed on Sep. 27, 2016. The contents of these applications are incorporated herein by reference in their entireties.

BACKGROUND OF THE DISCLOSURE

Field of the Disclosure

The present invention relates to a radio frequency front end circuit including multiple filters and a communication apparatus.

Description of the Related Art

For a filter module including multiple filters associated with multiple bands, a configuration including a switch circuit that allows the multiple filters to be selectively connected to an antenna terminal has been known (for example, see Patent Document 1). For such a filter module, for example, an impedance matching circuit is provided between the switch circuit and each of the multiple filters to be connected to the switch circuit.

Patent Document 1: WO 2013/021626

BRIEF SUMMARY OF THE DISCLOSURE

However, with the conventional configuration described above, there is a need to provide a separate impedance matching circuit for each of the multiple filters, and such a configuration interferes with the size reduction of the circuit.

Furthermore, for example, in the case where CA (Carrier Aggregation) in which radio frequency signals of multiple frequency bands are transmitted or received at the same time with the conventional configuration described above, when the number of filters selected by the switch circuit is two or more, the problems described below may occur. That is, in the case of non-CA (non-Carrier Aggregation) or the like, impedance deviation is caused by a change in the number of filters selected by the switch circuit, compared to the case where the number of filters selected by the switch circuit is 1.

Accordingly, in such a case, it is difficult to achieve the impedance matching by an impedance matching circuit, thereby increasing loss.

Thus, an object of the present invention is to provide a radio frequency front end circuit and a communication apparatus with a smaller size and less loss.

To achieve the above object, a radio frequency front end circuit according to an aspect of the present invention includes a switch circuit that includes a common terminal connected to an input/output terminal and a plurality of selection terminals selectively connected to the common terminal; a first filter that is connected to a first selection terminal among the plurality of selection terminals; a second filter that is connected to a second selection terminal among the plurality of selection terminals and includes a pass band different from a pass band of the first filter; and a first impedance element. The switch circuit includes a first main switch that switches between connection and non-connection between the common terminal and the first selection terminal according to ON and OFF, a first sub-switch that switches between connection and non-connection between the first selection terminal and ground according to exclusive ON and OFF relative to ON and OFF of the first main switch, a second main switch that switches between connection and non-connection between the common terminal and the second selection terminal according to ON and OFF not restricted from ON and OFF of the first main switch, and a second sub-switch that switches between connection and non-connection between the second selection terminal and the ground according to exclusive ON and OFF relative to the second main switch. The switch circuit is switched between a first connection form in which only one of the first main switch and the second main switch is ON and a second connection form in which both the first main switch and the second main switch are ON. The first impedance element is connected to a node on a path that connects the first selection terminal with the first filter and a node on a path that connects the second selection terminal with the second filter.

Accordingly, in the case where the switch circuit is in the first connection form in which only one of the first main switch and the second main switch is ON, the first impedance element is connected to the ground with one of the first sub-switch and the second sub-switch interposed therebetween. Therefore, at this time, the first impedance element operates as an impedance element for an impedance matching circuit. In contrast, in the case where the switch circuit is in the second connection form in which both the first main switch and the second main switch are ON, the ends of the first impedance element are short-circuited with the first main switch and the second main switch interposed therebetween. Therefore, at this time, the first impedance element does not operate. That is, according to this aspect, an impedance matching circuit can be changed according to the connection form of the switch circuit, without adding an impedance element serving as an impedance matching circuit, and a reduction in size and minimization of loss can thus be achieved.

Furthermore, the switch circuit may be switched between a first connection form in which only one of the first main switch and the second main switch is ON and a second connection form in which both the first main switch and the second main switch are ON. The first impedance element may cause an impedance of the input/output terminal to match a standardized impedance only in a case where the switch circuit is in the first connection form, out of the first connection form and the second connection form.

As described above, being able to switch between matching and mismatching by the first impedance element according to whether the switch circuit is in the first connection form or the second connection form is equivalent to configuring two impedance matching circuits using a single impedance element (first impedance element). Therefore, the number of elements forming the impedance matching circuit can be reduced, and a reduction in size can be achieved.

Furthermore, the radio frequency front end circuit may further include a second impedance element that allows connection between the common terminal and the ground. In a case where the switch circuit is in a first connection form in which only one of the first main switch and the second main switch is ON, a parallel circuit including the first impedance element and the second impedance element may cause an impedance of the input/output terminal to match a standardized impedance. In a case where the switch circuit is in a second connection form in which both the first main switch and the second main switch are ON, only the second impedance element, out of the first impedance element and the second impedance element, may cause the impedance of the input/output terminal to match the standardized impedance.

Accordingly, in the case where the switch circuit is in the first connection form, the impedance matching circuit that includes the parallel circuit including the first impedance element and the second impedance element may cause the impedance of the input/output terminal to match the standardized impedance, and in the case where the switch circuit is in the second connection form, the impedance matching circuit that includes the second impedance element may cause the impedance of the input/output terminal to match the standardized impedance. Therefore, minimization of loss can be achieved, regardless of whether the switch circuit is in the first connection form or the second connection form.

Furthermore, each of the first filter and the second filter may be an elastic wave filter including an acoustic wave resonator.

Accordingly, the compact, low-profile first filter and second filter having filter characteristics with excellent steepness (high selectivity) can be achieved. That is, according to this aspect, a low-loss, high-selectivity radio frequency front end circuit can be achieved while the size is reduced.

Furthermore, the first impedance element may be a capacitor, and the second impedance element may be an inductor.

In the acoustic wave filters configuring the first filter and the second filter, in terms of structure, the impedance often exhibits capacitive characteristics. Therefore, with the use of a capacitor as the first impedance element and the use of an inductor as the second impedance element, the impedance of the input/output terminal can be made to match the standardized impedance, regardless of whether the switch circuit is in the first connection form or the second connection form. Thus, minimization of loss can be achieved. That is, according to this aspect, a low-loss, high-selectivity radio frequency front end circuit can be achieved while the size is reduced.

Furthermore, a susceptance component within a pass band of the first filter single unit when viewed from the first selection terminal side may be smaller than a susceptance component within a pass band of the second filter single unit when viewed from the second selection terminal side. The radio frequency front end circuit may further include a third impedance element that allows connection between the first selection terminal and the ground. In a case where the switch circuit is in the first connection form in which only the first main switch is ON, a parallel circuit including the first impedance element, the second impedance element, and the third impedance element may cause the impedance of the input/output terminal to match the standardized impedance. In a case where the switch circuit is in the first connection form in which only the second main switch is ON, a parallel circuit including the first impedance element and the second impedance element may cause the impedance of the input/output terminal to match the standardized impedance. In a case where the switch circuit is in the second connection form, a parallel circuit including the second impedance element and the third impedance element may cause the impedance of the input/output terminal to match the standardized impedance.

Accordingly, even in the case where the susceptance component within the pass band of the first filter single unit when viewed from the first selection terminal is smaller than the susceptance component within the pass band of the second filter single unit when viewed from the second selection terminal, the impedance matching circuit can be changed according to the connection form of the switch circuit. Therefore, a reduction in size and minimization of loss can be achieved.

Furthermore, the third impedance element may be a capacitor. In a case where the first impedance element is a capacitor, a capacitance value of the third impedance element may be smaller than a capacitance value of the first impedance element.

Accordingly, in the case where the susceptance component within the pass band of each of the first filter single unit and the second filter single unit is larger than j0, that is, in the case where each of the first filter single unit and the second filter single unit exhibits capacitive characteristics in the pass band thereof, a reduction in size and minimization of loss can be achieved.

Furthermore, a susceptance component within a pass band of the first filter single unit when viewed from the first selection terminal side may be smaller than a susceptance component within a pass band of the second filter single unit when viewed from the second selection terminal side. An off capacitance of the first sub-switch may be larger than an off capacitance of the second sub-switch.

Accordingly, the number of impedance elements can be reduced, and a further reduction in size can thus be achieved.

Furthermore, a susceptance component within a pass band of the first filter single unit when viewed from the first selection terminal side and a susceptance component within a pass band of the second filter single unit when viewed from the second selection terminal side may be equivalent to each other.

Accordingly, by addition of the first impedance element, the admittance at the input/output terminal can be shifted to substantially the same position on an admittance chart between the case where the switch circuit is in the first connection form in which only the first main switch is ON and the case where the switch circuit is in the first connection form in which only the second main switch is ON. Therefore, by appropriately adjusting the constant of the first impedance element, the impedance of the input/output terminal can be made to match the standardized impedance in any of the cases mentioned above. Accordingly, an increase in the number of components can be suppressed, and a further reduction in size can thus be achieved.

Furthermore, at least one of the first filter and the second filter may include multiple filters. The multiple filters may configure a multiplexer in which one terminals of the multiple filters are common-connected and connected to the switch circuit.

Accordingly, for example, a radio frequency front end circuit for transmission and reception supporting CA can be achieved.

Furthermore, the switch circuit may be switched between a first connection form in which only one of the first main switch and the second main switch is ON and a second connection form in which both the first main switch and the second main switch are ON. The radio frequency front end circuit may further include a controller that causes the switch circuit to enter the second connection form in a case where carrier aggregation is performed in which transmission or reception of a first frequency band allocated to a pass band of the first filter and a second frequency band allocated to a pass band of the second filter is performed at the same time and causes the switch circuit to enter the first connection form in a case where non-carrier aggregation is performed in which transmission or reception of only one of the first frequency band and the second frequency band is performed.

Furthermore, a radio frequency front end circuit according to another aspect of the present invention includes a switch circuit that includes a common terminal connected to an input/output terminal and a plurality of selection terminals selectively connected to the common terminal; a first filter that is connected to a first selection terminal among the plurality of selection terminals; a second filter that is connected to a second selection terminal among the plurality of selection terminals; and a first impedance element. The switch circuit includes a first switch that allows the first selection terminal to be selectively connected to one of the common terminal and a ground terminal, and a second switch that allows the second selection terminal to be selectively connected to one of the common terminal and the ground terminal. The first impedance element is connected to a node on a path that connects the first selection terminal with the first filter and a node on a path that connects the second selection terminal with the second filter.

Accordingly, the number of switches can be reduced, and a reduction in size can be achieved.

Furthermore, the radio frequency front end circuit may further include a plurality of pairs each including a first switch circuit as the switch circuit, the first filter, the second filter, and the first impedance element; a second switch circuit that includes a common terminal, a first selection terminal, and a second selection terminal; and a fourth impedance element. The first selection terminal included in the second switch circuit may be selectively connected to one of the common terminal and a ground terminal included in the second switch circuit. The second selection terminal included in the second switch circuit may be selectively connected to one of the common terminal and the ground terminal included in the second switch circuit. The common terminal included in the first switch circuit in a first pair out of the plurality of pairs may be connected to the first selection terminal included in the second switch circuit. The common terminal included in the first switch circuit in a second pair out of the plurality of pairs may be connected to the second selection terminal included in the second switch circuit. The fourth impedance element may be connected to a node on a path that connects the first selection terminal included in the second switch circuit with the common terminal included in the first switch circuit in the first pair and a node on a path that connects the second selection terminal included in the second switch circuit with the common terminal included in the first switch circuit in the second pair.

Accordingly, four or more frequency bands can be supported while a reduction in size and minimization of loss are achieved.

Furthermore, a communication apparatus according to an aspect of the present invention includes an RF signal processing circuit that processes a radio frequency signal transmitted and received at an antenna element; and the radio frequency front end circuit that transmits the radio frequency signal between the antenna element and the RF signal processing circuit.

Accordingly, a communication apparatus with a smaller size and less loss can be provided.

With a radio frequency front end circuit and a communication apparatus according to the present invention, a reduction in size and minimization of loss can be achieved.

BRIEF DESCRIPTION OF THE SEVERAL VIEWS OF THE DRAWINGS

FIGS. 7A to 7D include diagrams illustrating characteristics of a duplexer single unit supporting Band 26 in an example.

FIGS. 8A to 8D include diagrams illustrating characteristics of a duplexer single unit supporting Band 12 in an example.

FIGS. 9A to 9D include first diagrams illustrating characteristics in a state in which two duplexers are tied together in an example.

FIGS. 10A to 10D include first diagrams illustrating characteristics at the time of CA between Band 26 and Band 12 in the radio frequency front end circuit according to an example.

FIGS. 10E to 10G include second diagrams illustrating characteristics at the time of CA between Band 26 and Band 12 in the radio frequency front end circuit according to the example.

FIGS. 11A to 11D include diagrams illustrating characteristics at the time of non-CA for Band 26 in the radio frequency front end circuit according to an example.

FIGS. 11E to 11H include diagrams illustrating characteristics at the time of non-CA for Band 12 in the radio frequency front end circuit according to the example.

DETAILED DESCRIPTION OF THE DISCLOSURE

Hereinafter, embodiments of the present invention will be described in detail based on examples and drawings. The embodiments described hereinafter illustrate either general or specific examples. Numerical values, shapes, materials, components, and arrangement and connection forms of the components, and the like illustrated in the embodiments described below are merely examples, and are not intended to limit the present invention. Components in the embodiments described below, except those described in the independent claims, will be explained as optional components. Furthermore, in each of the drawings, for substantially the same configuration, same reference signs will be provided, and redundant explanation will be omitted or simplified.

First Embodiment

1. Overview

[1-1. Configuration]

Figure 1:
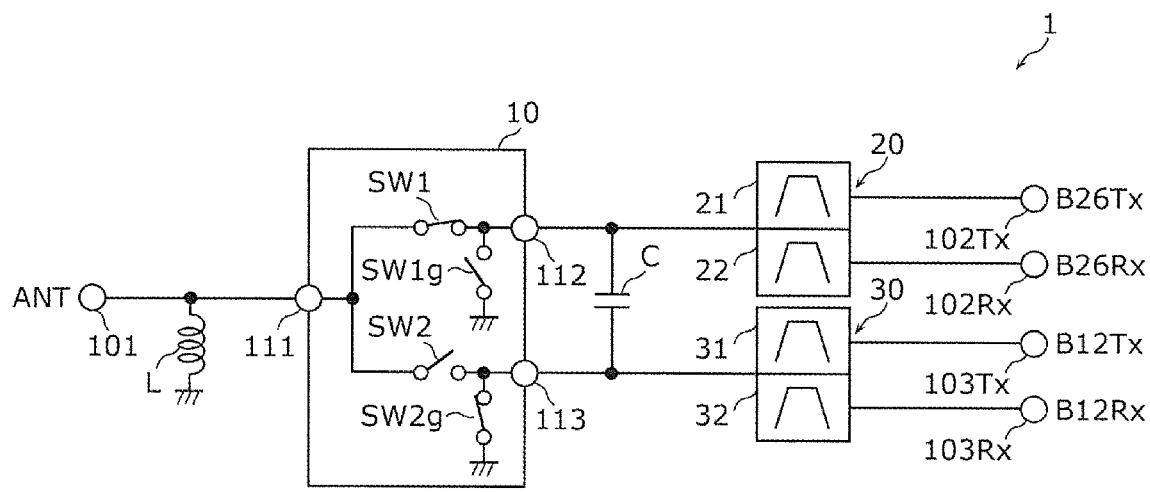
FIG. 1 is a configuration diagram of a radio frequency front end circuit according to a first embodiment.

FIG. 1 is a configuration diagram of a radio frequency front end circuit 1 according to a first embodiment.

The radio frequency front end circuit 1 is a circuit that transmits a radio frequency signal among an antenna element (not illustrated), an amplifier (not illustrated), and an RFIC (Radio Frequency Integrated Circuit, not illustrated). The antenna element, the amplifier, and the RFIC are provided outside the radio frequency front end circuit 1. Thus, in this embodiment, the radio frequency front end circuit 1 functions as a multiplexer. The amplifier may be built in the radio frequency front end circuit 1.

In this embodiment, the radio frequency front end circuit 1 supports LTE (Long Term Evolution) and transmits a radio frequency signal of a Band (frequency band) defined by 3GPP (Third Generation Partnership Project). Specifically, the radio frequency front end circuit 1 supports Band 26 and Band 12 defined by 3GPP and transmits a radio frequency signal of the corresponding Band.

Hereinafter, a "Band defined by 3GPP" may be simply referred to as a "Band", and a reception band (Rx band) or a transmission band (Tx band) of each Band may be referred to in a simplified manner as a band name and a wording added to the ending of the band name indicating a reception band or a transmission band, such as "B26 Rx" for a reception band of Band 26, for example.

In this embodiment, the radio frequency front end circuit 1 performs filtering on radio frequency signals (in this case, radio frequency reception signals) received at an antenna element and inputted to an antenna (ANT) terminal 101 to allow radio frequency signals of predetermined frequencies to pass, and causes the radio frequency signals to be outputted from a plurality of individual terminals (in this case, two reception terminals, specifically, a B26 Rx terminal 102Rx, which is a reception terminal for Band 26, and a B12 Rx terminal 103Rx, which is a reception terminal for Band 12) via an amplifier to an RFIC. On the contrary, the radio frequency front end circuit 1 amplifies radio frequency signals (in this case, radio frequency transmission signals) inputted to a plurality of individual terminals (in this case, two transmission terminals, specifically, a B26 Tx terminal 102Tx, which is a transmission terminal for Band 26, and a B12 Tx terminal 103Tx, which is a reception terminal for Band 12) from the RFIC, and performs filtering to allow radio frequency signals of specific frequencies to pass and be outputted to the antenna element from the ANT terminal 101. In this embodiment, the ANT terminal 101 is an input/output terminal for inputting and outputting a radio frequency signal. An input/output terminal is not necessarily connected to an antenna element. An input/output terminal may be connected to another circuit element such as an amplifier. That is, the ANT terminal 101 in this embodiment may be a terminal connected to an amplifier or the like.

Specifically, the radio frequency front end circuit 1 includes a switch circuit 10, multiple filters (in this embodiment, a duplexer 20 including a transmission filter 21 and a reception filter 22 and a duplexer 30 including a transmission filter 31 and a reception filter 32), and a capacitor C (first impedance element). Furthermore, in this embodiment, the radio frequency front end circuit 1 further includes an inductor L (second impedance element).

The switch circuit 10 includes a common terminal 111 and a plurality of selection terminals (in this embodiment, a selection terminal 112 (first selection terminal) and a selection terminal 113 (second selection terminal)) that are selectively connected to the common terminal 111. The common terminal 111 is connected to the ANT terminal 101 of the radio frequency front end circuit 1, and the plurality of selection terminals are individually connected to the plurality of individual terminals of the radio frequency front end circuit 1 with the multiple filters mentioned above interposed therebetween.

Specifically, the switch circuit 10 includes a main switch SW1 (first main switch) of an SPST (Single-Pole, Single-Throw) type that switches between connection (conduction) and non-connection (non-conduction) between the common terminal 111 and the selection terminal 112 (first selection terminal) according to ON (conduction) and OFF (non-conduction). Furthermore, the switch circuit 10 includes a sub-switch Swig (first sub-switch) of the SPST type that switches between connection and non-connection between the selection terminal 112 (first selection terminal) and the ground according to exclusive ON and OFF relative to the main switch SW1 (first main switch). Furthermore, the switch circuit 10 includes a main switch SW2 (second main switch) of the SPST type that switches between connection and non-connection between the common terminal 111 and the selection terminal 113 (second selection terminal) according to ON and OFF, which is not restricted by ON and OFF of the main switch SW1. Furthermore, the switch circuit 10 includes a sub-switch SW2g (second sub-switch) of the SPST type that switches between connection and non-connection between the selection terminal 113 (second selection terminal) and the ground according to exclusive ON and OFF relative to the main switch SW2.

"Exclusive ON and OFF" represents a state in which one side is ON while the other side is OFF or one side is OFF while the other side is ON. For the main switch SW1 and the sub-switch SW1g, the main switch SW1 is ON while the sub-switch SW1g is OFF, and the main switch SW1 is OFF while the sub-switch SW1g is ON. For the main switch SW2 and the sub-switch SW2g, the main switch SW2 is ON while the sub-switch SW2g is OFF, and the main switch SW2 is OFF while the sub-switch SW2g is ON.

Furthermore, a state in which ON and OFF of the main switch SW2 is not restricted by ON and OFF of the main switch SW1 represents a state in which the main switch SW2 may be ON or off regardless of whether the main switch SW1 is ON or OFF. That is, the main switch SW1 and the main switch SW2 are ON and OFF independent of each other.

With the switch circuit 10 configured as described above, when the main switch SW1 between the common terminal 111 and the selection terminal 112 is ON, the sub-switch SW1g between the selection terminal 112 and the ground terminal is OFF, and therefore, connection between the common terminal 111 and the selection terminal 112 can be obtained. In contrast, when the main switch SW1 between the common terminal 111 and the selection terminal 112 is OFF, the sub-switch SW1g between the selection terminal 112 and the ground terminal is ON, and therefore, non-connection between the common terminal 111 and the selection terminal 112 and isolation between the common terminal 111 and the selection terminal 112 can be obtained. The features described above are not limited to the main switch SW1 and the sub-switch Swig that are connected to the selection terminal 112, and the same applies to the main switch SW2 and the sub-switch SW2g that are connected to the selection terminal 113.

As switches (the main switches SW1 and SW2 and the sub-switches Swig and SW2g) forming the switch circuit 10 described above, for example, FET (Field Effect Transistor) switches including GaAs or CMOS (Complementary Metal Oxide Semiconductor) or diode switches may be used. Furthermore, the switch circuit 10 may be configured as a switch IC (Integrated Circuit) including a plurality of switches. Furthermore, each of the switches is not necessarily a semiconductor switch formed at a semiconductor substrate, and may be a mechanical switch of MEMS (Micro Electro Mechanical Systems).

Figure 2A:
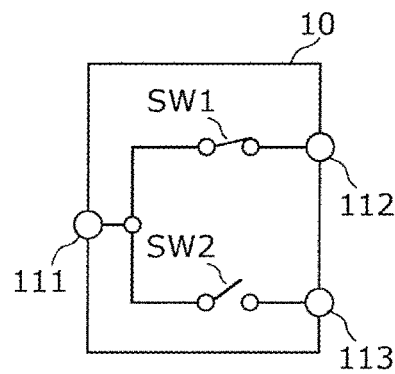
FIG. 2A is an example of a block diagram illustrating a switch circuit in the first embodiment.
Figure 2B:
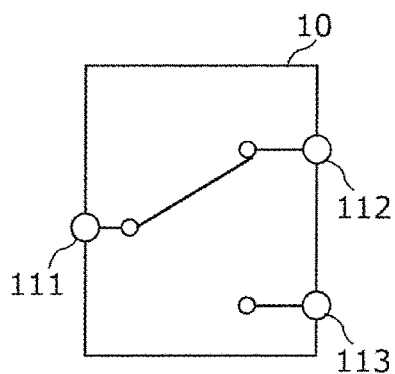
FIG. 2B is another example of the block diagram of the switch circuit in the first embodiment.

The switch circuit 10 used in a radio frequency circuit such as the radio frequency front end circuit 1 or the like is generally illustrated by block diagrams as illustrated in FIGS. 2A and 2B. FIG. 2A is an example of a block diagram illustrating the switch circuit 10 in this embodiment. FIG. 2B is another example of the block diagram. The switch circuit 10 of the SPDT type illustrated in these block diagrams also includes, as the internal configuration, the main switches SW1 and SW2 and the sub-switches Swig and SW2g illustrated in FIG. 1. That is, the switch circuit 10 does not necessarily have a configuration explicitly including the main switches SW1 and SW2 and the sub-switches Swig and SW2g. The switch circuit 10 may have a configuration in which a part of the main switches SW1 and SW2 and the sub-switches Swig and SW2g is omitted, as illustrated in FIGS. 2A and 2B.

Specifically, the switch circuit 10 illustrated in FIG. 2A has a configuration in which the main switch SW1 and the main switch SW2 are independently turned on and turned off. That is, the switch circuit 10 illustrated in FIG. 2A can achieve any of a connection form in which only one of the main switches SW1 and SW2 is ON, a connection form in which both the main switches SW1 and SW2 are ON, and a connection form in which both the main switches SW1 and SW2 are OFF.

The switch circuit 10 illustrated in FIG. 2B is often illustrated as having a configuration in which the common terminal 111 is connected to only one of the selection terminals 112 and 113. In other words, the switch circuit 10 illustrated in FIG. 2B is often illustrated as being able to achieve a connection form in which only one of the main switches SW1 and SW2 is ON but being unable to achieve a connection form in which both the main switches SW1 and SW2 are ON or a connection form in which both the main switches SW1 and SW2 are OFF. However, the switch circuit 10 illustrated in FIG. 2B can also achieve connection forms similar to those for the switch circuit 10 illustrated in FIG. 1 or FIG. 2A as long as the main switches SW1 and SW2 and the sub-switches SW1g and SW2g are included as the actual configuration. Therefore, the switch circuit 10 according to this embodiment is not limited by symbol notation represented in block diagrams and the like and is limited by the internal circuit configuration or connection form.

The duplexer 20 supports Band 26 in this embodiment. The duplexer 20 includes the transmission filter 21 that includes the Tx band of Band 26 in the pass band and includes the Rx band of Band 26 in the attenuation band and the reception filter 22 that includes the Rx band of Band 26 in the pass band and includes the Tx band of Band 26 in the attenuation band. One of input and output terminals (in this case, the output terminal) of the transmission filter 21 and one of input and output terminals (in this case, the input terminal) of the reception filter 22 are common-connected (tied together) by a common terminal of the duplexer 20 and are connected to the selection terminal 112 of the switch circuit 10. Furthermore, the other one of the input and output terminals (in this case, the input terminal) of the transmission filter 21 is connected to the B26 Tx terminal 102Tx. Furthermore, the other one of the input and output terminals (in this case, the output terminal) of the reception filter 22 is connected to the B26 Rx terminal 102Rx.

The duplexer 30 has a pass band different from that of the duplexer 20 and supports Band 12 in this embodiment. The duplexer 30 includes the transmission filter 31 that includes the Tx band of Band 12 in the pass band and includes the Rx band of Band 12 in the attenuation band and the reception filter 32 that includes the Rx band of Band 12 in the pass band and includes the Tx band of Band 12 in the attenuation band. One of input and output terminals (in this case, the output terminal) of the transmission filter 31 and one of input and output terminals (in this case, the input terminal) of the reception filter 32 are common-connected (tied together) by a common terminal of the duplexer 30 and are connected to the selection terminal 113 of the switch circuit 10. Furthermore, the other one of the input and output terminals (in this case, the input terminal) of the transmission filter 31 is connected to the B12 Tx terminal 103Tx. Furthermore, the other one of the input and output terminals (in this case, the output terminal) of the reception filter 32 is connected to the B12 Rx terminal 103Rx.

In this embodiment, each of the duplexers 20 and 30 (a first filter and a second filter) is an acoustic wave filter including an acoustic wave resonator. Specifically, the transmission filter 21 and the reception filter 22 forming the duplexer 20 and the transmission filter 31 and the reception filter 32 forming the duplexer 30 are each an acoustic wave filter configured as a circuit including an acoustic wave resonator. An acoustic wave resonator may be, for example, a resonator using a surface acoustic wave, a bulk wave, or a boundary acoustic wave.

Furthermore, the pass band of the duplexer 20 and the pass band of the duplexer 30 are different from each other and those frequencies do not overlap. That is, pass bands of two or more filters that are common-connected by the switch circuit 10 (in this embodiment, four filters including the transmission filter 21 and the reception filter 22 forming the duplexer 20 and the transmission filter 31 and the reception filter 32 forming the duplexer 30) have different frequencies and those frequencies do not overlap.

The capacitor C is the first impedance element that allows connection between the selection terminal 112 (first selection terminal) and the selection terminal 113 (second selection terminal). A state in which the capacitor C "allows connection between the selection terminal 112 and the selection terminal 113" does not necessarily represent a configuration in which one end of the capacitor C is directly connected to the selection terminal 112 and the other end of the capacitor C is directly connected to the selection terminal 113. For example, one end of the capacitor C may be connected to a transmission line that connects the selection terminal 112 with the duplexer 20 and the other end may be connected to a transmission line that connects the selection terminal 113 with the duplexer 30. That is, the capacitor C may be connected to a node on a line that connects the selection terminal 112 with the duplexer 20 and a node on a line that connects the selection terminal 113 with the duplexer 30.

The inductor L is the second impedance element that allows connection between the common terminal 111 and the ground. A state in which the inductor L "allows connection between the common terminal 111 and the ground" does not necessarily represent a configuration in which one end of the inductor L is directly connected to the common terminal 111 and the other end of the inductor L is directly connected to the ground. For example, one end of the inductor L may be connected to a transmission line that connects the ANT terminal 101 with the common terminal 111.

The configuration of the radio frequency front end circuit 1 has been described above. However, the configuration of the radio frequency front end circuit 1 is not limited to the above. For example, Bands that the radio frequency front end circuit 1 supports are not necessarily B26 and B12, and the radio frequency front end circuit 1 may support other Bands. The number of Bands that the radio frequency front end circuit 1 supports is not necessarily two and may be three or more. Therefore, the number of selection terminals of the switch circuit 10, the number of duplexers (or filters), the number of individual terminals of the radio frequency front end circuit 1, and the like are not limited to the numbers described above. That is, the switch circuit 10 may include n (n is an integer of 3 or more) main switches and n sub-switches.

[1-2. Operation]

The radio frequency front end circuit 1 configured as described above operates as described below in accordance with a control signal from a controller (not illustrated) of the RFIC or the like.

That is, the switch circuit 10 is switched between the first connection form in which only one of the main switch SW1 (first main switch) and the main switch SW2 (second main switch) is ON and the second connection form in which both the main switches SW1 and SW2 are ON.

Specifically, the switch circuit 10 enters the second connection form described above when CA is performed in which transmission or reception of Band 26 (first frequency band) allocated to the pass band of the duplexer 20 (first filter) and Band 12 (second frequency band) allocated to the pass band of the duplexer 30 (second filter) is performed at the same time. That is, at the time of CA, both the main switches SW1 and SW2 are turned on in the switch circuit 10, and multiple devices (in this case, the two devices: the duplexers 20 and 30, hereinafter, referred to as "multiple devices") are thus selected. As a result, the radio frequency front end circuit 1 performs filtering, with the selected duplexers 20 and 30, on a radio frequency signal being transmitted between the antenna element (not illustrated) and the RFIC (not illustrated), and transmits the filtered signal.

In contrast, the switch circuit 10 enters the first connection form described above when non-CA is performed in which transmission or reception of Band 26 or Band 12 is performed. That is, at the time of non-CA, only one of the main switches SW1 and SW2 is turned on in the switch circuit 10, and a single device (in this case, the duplexer 20 or 30, hereinafter, referred to as a "single device") is thus selected. As a result, the radio frequency front end circuit 1 performs filtering, with the selected duplexer 20 or 30, on a radio frequency signal being transmitted between the antenna element (not illustrated) and the RFIC (not illustrated), and transmits the filtered signal.

Figure 3A:
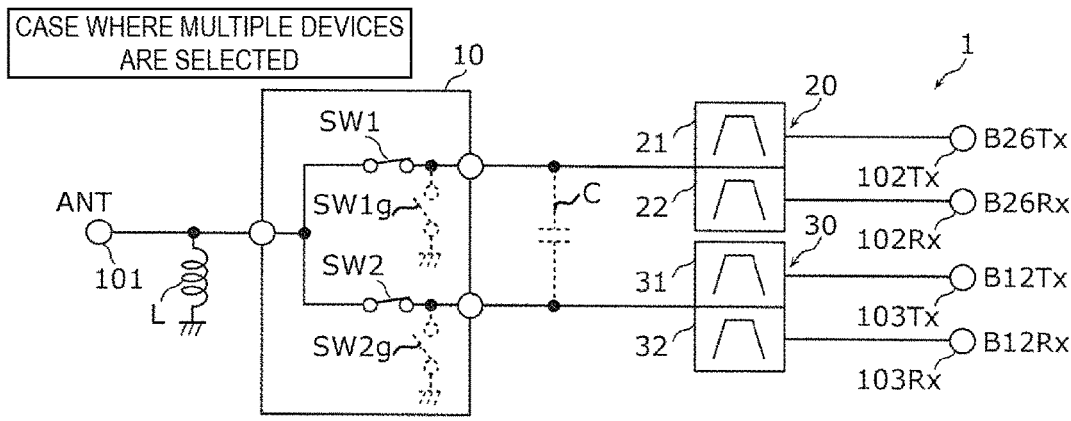
FIG. 3A is a diagram schematically illustrating a configuration of the radio frequency front end circuit according to the first embodiment in the case where multiple devices are selected.
Figure 3B:
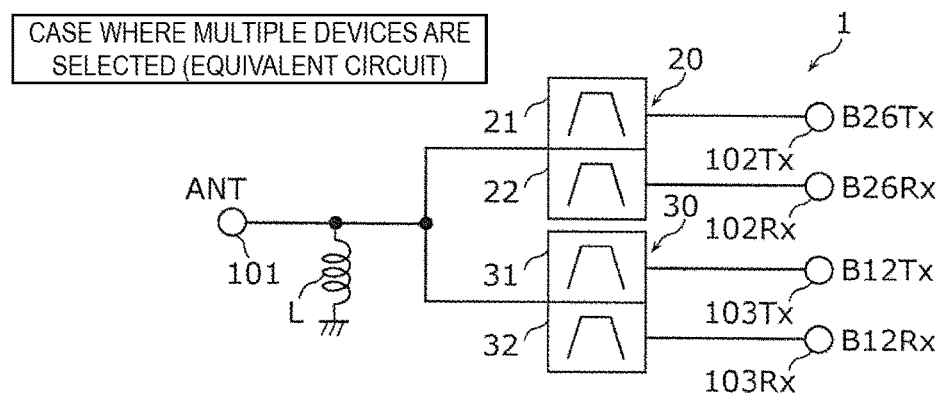
FIG. 3B is an equivalent circuit diagram of FIG. 3A.

FIG. 3A is a diagram schematically illustrating a configuration of the radio frequency front end circuit 1 according to the first embodiment in the case where multiple devices (in this case, the duplexers 20 and 30) are selected. FIG. 3B is an equivalent circuit diagram of FIG. 3A. In FIG. 3A, parts that operate in terms of circuit are indicated by solid lines, and parts that do not operate in terms of circuit are indicated by broken lines. The same applies to similar figures. Moreover, for the sake of simplicity, in the explanation provided below, an inductor and a resistor inserted between terminals of switches in an ON state in the switch circuit 10 are set to a value of zero. Therefore, in the actual circuit design, constants of the capacitor C (first impedance element), the inductor L (second impedance element), and the like may be different from values explained below.

As illustrated in FIGS. 3A and 3B, in the case where the duplexers 20 and 30 are selected, the ends of the capacitor C are short-circuited with the main switches SW1 and SW2 interposed therebetween. Therefore, in such a case, the common terminals (the terminals on the ANT terminal 101 side) of the selected duplexers 20 and 30 are connected to the ground only by the inductor L (second impedance element), without the capacitor C operating. That is, in the case where the switch circuit 10 is in the second connection form (that is, both the main switches SW1 and SW2 are ON), the impedance of the ANT terminal 101 is made to match a standardized impedance only by the inductor L, out of the capacitor C (first impedance element) and the inductor L (second impedance element). In other words, at this time, the inductor L configures an impedance matching circuit.

Figure 4A:
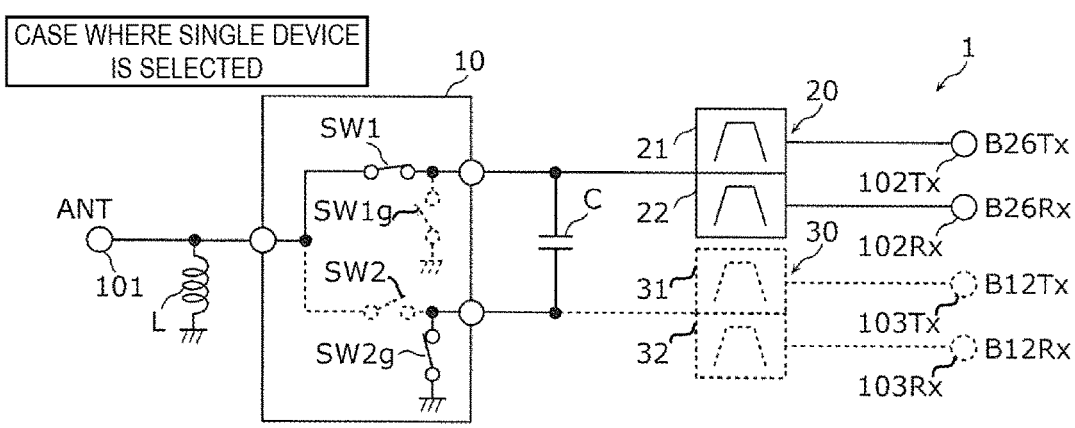
FIG. 4A is a diagram schematically illustrating a configuration of the radio frequency front end circuit according to the first embodiment in the case where a single device is selected.
Figure 4B:
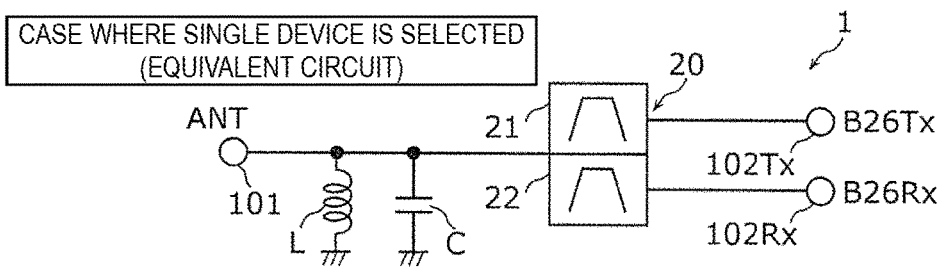
FIG. 4B is an equivalent circuit diagram of FIG. 4A.

FIG. 4A is a diagram schematically illustrating a configuration of the radio frequency front end circuit 1 according to the first embodiment in the case where a single device (in this case, the duplexer 20) is selected. FIG. 4B is an equivalent circuit diagram of FIG. 4A.

In this embodiment, the connection form in the case where a single device is selected is the same between the case where the duplexer 20 is selected and the case where the duplexer 30 is selected, with the exception that ON and OFF of the main switches SW1 and SW2 and the sub-switches SW1g and SW2g are replaced. Therefore, hereinafter, explanation will be provided for the case where the duplexer 20 is selected, and explanation for the case where the duplexer 30 is selected will be omitted.

As illustrated in FIGS. 4A and 4B, in the case where only the duplexer 20 is selected, the capacitor C is connected (shunt-connected) to the ground with the sub-switch SW2g, which corresponds to the non-selected duplexer 30, interposed therebetween. Therefore, in such a case, the common terminal of the selected duplexer 20 and the ground are connected by a parallel circuit including the capacitor C (first impedance element) and the inductor L (second impedance element). That is, in the case where the switch circuit 10 is in the first connection form (that is, only one of the main switches SW1 and SW2 is ON), the impedance of the ANT terminal 101 is made to match the standardized impedance by the parallel circuit including the capacitor C (first impedance element) and the inductor L (second impedance element). In other words, at this time, the parallel circuit including the capacitor C and the inductor L configures an impedance matching circuit.

As described above, according to this embodiment, impedance matching (an impedance matching circuit) may be changed between the case where multiple devices are selected and the case where a single device is selected, without adding an impedance element configuring an impedance matching circuit. That is, in the case where multiple devices are selected, only the inductor L, out of the capacitor C (first impedance element) and the inductor L (second impedance element), is made to operate as an impedance matching circuit, whereas in the case where the single device is selected, both the capacitor C (first impedance element) and the inductor L (second impedance element) are made to operate as an impedance matching circuit.

[1-3. Impedance Matching]

The principle of impedance matching in this embodiment will be explained below.

Figure 5:
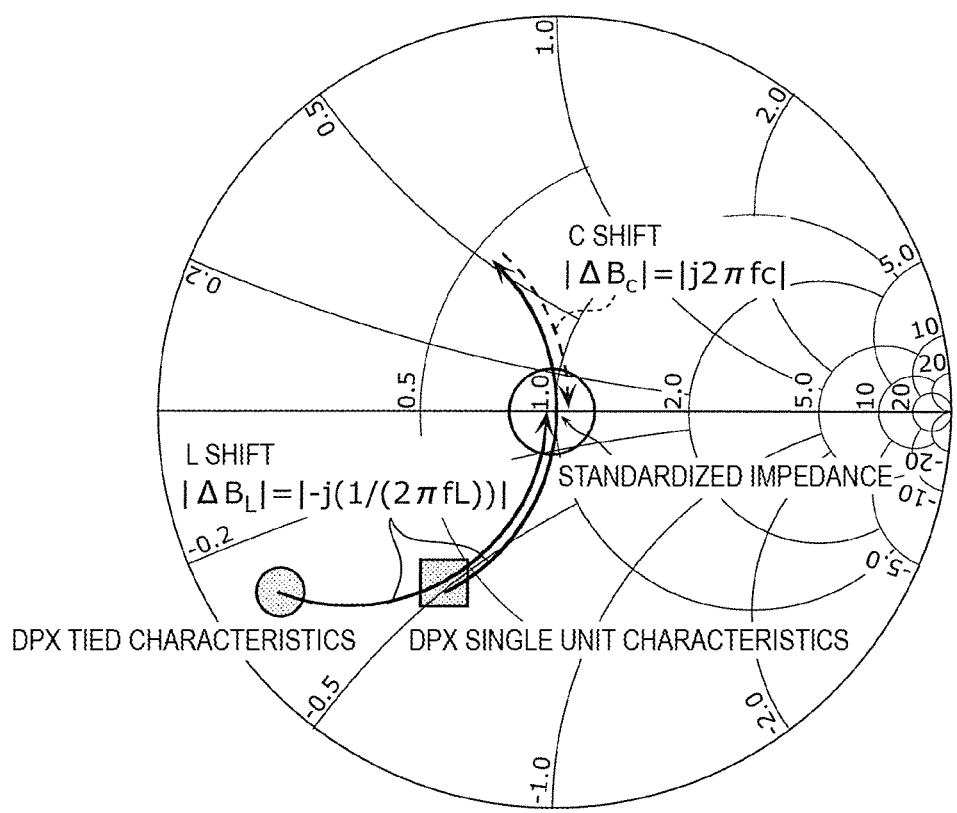
FIG. 5 is a Smith chart for explaining impedance matching in the first embodiment.

FIG. 5 is a Smith chart for explaining impedance matching in this embodiment. Hereinafter, an admittance, which is the reciprocal of an impedance, may be explained using a Smith chart. Therefore, a susceptance component, which is an imaginary number component of an admittance, may be explained below, and explanation may be provided using expression such as an equal-conductance circle that originally should be illustrated in an admittance chart not in a Smith chart. Furthermore, an impedance and an admittance when viewed from the ANT terminal 101 side will be explained below. That is, explanation will be provided defining a susceptance component of the duplexer 20 single unit when viewed from a terminal on a side connected to the selection terminal 112 as a susceptance component of the duplexer 20 single unit or a susceptance component of the duplexer 20 single unit when viewed from the selection terminal 112 side. In a similar manner, explanation will be provided defining a susceptance component of the duplexer 30 single unit when viewed from a terminal on a side connected to the selection terminal 113 as a susceptance component of the duplexer 30 single unit or a susceptance component of the duplexer 30 single unit when viewed from the selection terminal 113 side.

In each of the duplexers 20 and 30 including an acoustic wave filter, the impedance exhibits capacitive characteristics, in terms of its structure. Specifically, the impedance of each of the duplexer 20 single unit and the duplexer 30 single unit (hereinafter, referred to as "DPX single unit characteristics") is designed as a rectangular part indicated by "DPX single unit characteristics" on the Smith chart of FIG. 5.

Therefore, the impedance in the case where the common terminals of the duplexers 20 and 30 are common-connected (tied together) (hereinafter, referred to as "DPX tied characteristics") is located at a circular part indicated by "DPX tied characteristics" on the Smith chart of FIG. 5. Specifically, regarding each of the duplexers 20 and 30 including an acoustic wave filter, in the pass band thereof (own band), a partner duplexer that is tied with operates as a capacitor. That is, the own band of one of the duplexers 20 and 30 serves as an attenuation band of the other one of the duplexers 20 and 30. Therefore, the DPX tied characteristics exhibit more capacitive characteristics than the DPX single unit characteristics, and ideally, are located as shifted clockwise around an equal-susceptance circle on a Smith chart.

In general, in order to cause the impedance of the DPX single unit characteristics and the impedance of the DPX tied characteristics to match the standardized impedance (for example, 50Ω), an inductor for allowing connection between the common terminal of a duplexer and the ground is provided as an impedance matching circuit. However, the DPX single unit characteristics and the DPX tied characteristics do not match on a Smith chart, the inductance value needs to be changed between the case where a single duplexer is selected and the case where two duplexers are selected.

Therefore, for example, as an impedance matching circuit, a configuration in which a plurality of inductors having different inductance values are provided and switching between the plurality of inductors is performed by a switch is considered. However, it is difficult to reduce the size of such an impedance matching circuit.

In contrast, in this embodiment, impedance matching (an impedance matching circuit) can be changed between the case where a single duplexer is selected and the case where two duplexers are selected, without adding an impedance element serving as an impedance matching circuit. Therefore, a reduction in size can be achieved.

Specifically, the inductance value of the inductor L is set such that impedance matching can be achieved (that is, matching with the standardized impedance can be achieved) when the duplexers 20 and 30 are selected.

For example, L shift $|\Delta B_L|$, which is the amount of shift (the amount of change) of a susceptance by addition of the inductor L between a common terminal (terminal on the ANT terminal 101 side) and the ground, is represented by $|\Delta B_L|=|-j(1/2\pi f L)|$ at a frequency f, where the inductance value of the inductor L is represented by L. That is, by adding the inductor L, the impedance is shifted anticlockwise by the amount corresponding to the L shift $|\Delta B_L|$ on a Smith chart. Therefore, when the susceptance (an imaginary number component of an admittance) of the DPX tied characteristics is represented by $B_1$, by setting the inductor L to an inductance value L that satisfies the equation provided below, impedance matching can be achieved when the duplexers 20 and 30 are selected.

$$B1=|-j(1/2\pi f L)))|$$

In contrast, in the case where only the duplexer 20 or 30 is selected, the L shift $|\Delta B_L|$ by the inductor L causes the impedance to be shifted to exhibit more inductive characteristics than the standardized impedance. However, in the case where only the duplexer 20 or 30 is selected, the capacitor C operates. By appropriately setting the capacitive value (capacitance value) of the capacitor C, impedance matching can be achieved.

Specifically, C shift $|\Delta B_C|$, which is the amount of shift of a susceptance by addition of the capacitor C that is shunted to the ground, is represented by $|\Delta B_C|=|j2\pi fC|$ at a frequency f, where the capacitance value of the capacitor C is represented by C. That is, by adding the capacitor C, the impedance is shifted clockwise by the amount corresponding to the C shift $|\Delta B_C|$ on a Smith chart. Therefore, when the susceptance of the DPX single unit characteristics is represented by $B_2$, by setting the capacitor C to the capacitance value C that satisfies the equation provided below, impedance matching can be achieved when only the duplexer 20 or 30 is selected.

$$B2+|j2\pi fC|=|-j(1/(2\pi fL))|$$

As described above, according to this embodiment, an impedance matching circuit that matches two impedance states (the DPX tied characteristics and the DPX single unit characteristics) can be configured, without adding an impedance element serving as an impedance matching circuit.

In other words, with the impedance matching circuit configured as described above, the impedance for the case where the duplexers 20 and 30 side is viewed from the ANT terminal 101 varies as described below.

Figure 6A:
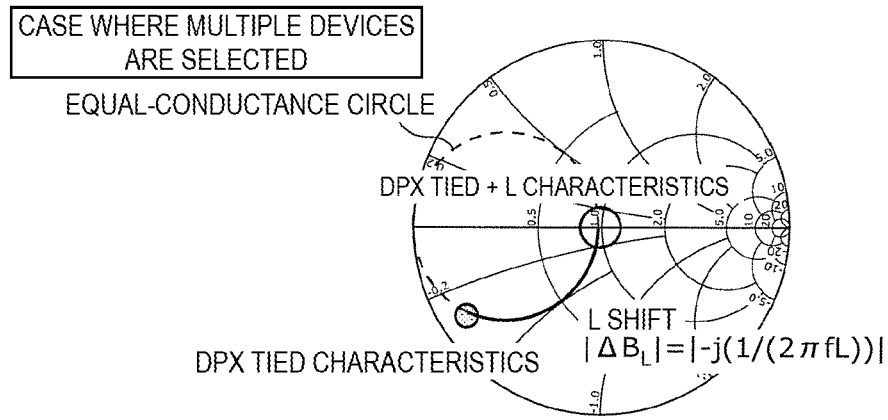
FIG. 6A is a Smith chart illustrating how impedance is changed by an impedance matching circuit in the case where multiple devices are selected in the first embodiment.
Figure 6B:
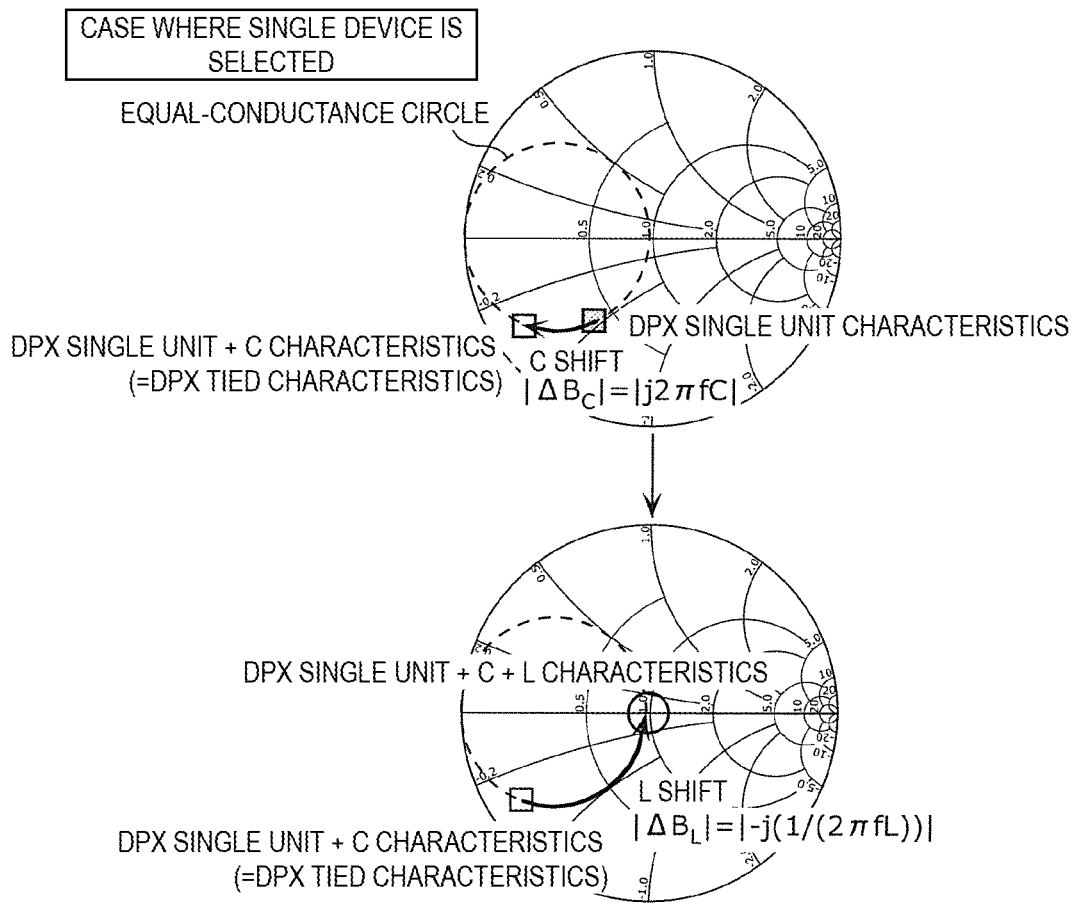
FIG. 6B includes Smith charts illustrating how impedance is changed by an impedance matching circuit in the case where a single device is selected in the first embodiment.

FIG. 6A is a Smith chart illustrating how impedance is changed by an impedance matching circuit in the case where multiple devices are selected (the case where the duplexers 20 and 30 are selected). FIG. 6B includes Smith charts illustrating how impedance is changed by an impedance matching circuit in the case where a single device is selected (the case where one of the duplexers 20 and 30 is selected).

As illustrated in FIG. 6A, in the case where the duplexers 20 and 30 are selected, the impedance of the DPX tied characteristics is shifted by the amount corresponding to the L shift $|\Delta B_L|$ by the inductor L configuring an impedance matching circuit, and therefore is made to match the standardized impedance. Accordingly, in the case where the duplexers 20 and 30 are selected, the radio frequency front end circuit 1 is able to reduce loss caused by impedance mismatching, and thus achieves minimization of loss.

In contrast, as illustrated in FIG. 6B, in the case where the duplexer 20 or 30 is selected, the impedance of the DPX single unit characteristics is shifted by the amount corresponding to the C shift $|\Delta B_C|$ by the capacitor C configuring an impedance matching circuit, and therefore is shifted to substantially the same impedance of the DPX tied characteristics. That is, the capacitor C has a capacitance value that compensates for a deviation between the impedance in the case where the duplexers 20 and 30 are selected (DPX tied characteristics) and the impedance in the case where the duplexer 20 or 30 is selected (DPX single unit characteristics). Then, the impedance of the DPX single unit characteristics that has been shifted by the amount corresponding to the C shift $|\Delta B_C|$ is shifted by the amount corresponding to the L shift $|\Delta B_L|$ by the inductor L configuring an impedance matching circuit, which means being shifted to the standardized impedance. Therefore, even in the case where the single duplexer 20 or 30 is selected, the radio frequency front end circuit 1 is able to reduce loss caused by impedance mismatching, as in the case where the duplexers 20 and 30 are selected. Thus, minimization of loss can be achieved.

2. Examples

The radio frequency front end circuit 1 according to this embodiment will be explained in detail below, based on the specific examples.

FIGS. 7A to 7D include diagrams illustrating characteristics of the duplexer 20 single unit supporting Band 26 in an example. Specifically, FIG. 7A is a configuration diagram of the duplexer 20 single unit. FIG. 7B is a graph indicating the bandpass characteristics of the duplexer 20 single unit, and the insertion loss between the B26 Tx terminal 102Tx and a B26 Com terminal 102Com (a solid line in the graph) and the insertion loss between the B26 Com terminal 102Com and the B26 Rx terminal 102Rx (a broken line in the graph) are illustrated. FIG. 7C is a Smith chart indicating the impedance characteristics of the B26 Com terminal 102Com in the B26 Tx band (a solid line in the chart) and the impedance characteristics of the B26 Tx terminal 102Tx in the B26 Tx band (a broken line in the chart). FIG. 7D is a Smith chart indicating the impedance characteristics of the B26 Com terminal 102Com in the B26 Rx band (a solid line in the chart) and the impedance characteristics of the B26 Rx terminal 102Rx in the B26 Rx band (a broken line in the chart). In this example, the B26 Com terminal 102Com mentioned above is a common terminal of the duplexer 20.

FIGS. 8A to 8D include diagrams indicating characteristics of the duplexer 30 single unit supporting Band 12 in an example. Specifically, FIG. 8A is a configuration diagram of the duplexer 30 single unit. FIG. 8B is a graph indicating the bandpass characteristics of the duplexer 30 single unit, and the insertion loss between the B12 Tx terminal 103Tx and a B12 Com terminal 103Com (a solid line in the graph) and the insertion loss between the B12 Com terminal 103Com and the B12 Rx terminal 103Rx (a broken line in the graph) are illustrated. FIG. 8C is a Smith chart indicating the impedance characteristics of the B12 Com terminal 103Com in the B12 Tx band (a solid line in the chart) and the impedance characteristics of the B12 Tx terminal 103Tx in the B12 Tx band (a broken line in the chart). FIG. 8D is a Smith chart indicating the impedance characteristics of the B12 Com terminal 103Com in the B12 Rx band (a solid line in the chart) and the impedance characteristics of the B12 Rx terminal 103Rx in the B12 Rx band (a broken line in the chart). In this example, the B12 Com terminal 103Com mentioned above is a common terminal of the duplexer 30.

As illustrated in FIGS. 7A to 7D, the impedance of the duplexer 20 single unit, specifically, the impedance when viewed from the B26 Com terminal 102Com, exhibits capacitive characteristics in Band 26 within the pass band of the duplexer 20. Furthermore, as illustrated in FIGS. 8A to 8D, the impedance of the duplexer 30 single unit, specifically, the impedance when viewed from the B12 Com terminal 103Com, exhibits capacitive characteristics in Band 12 within the pass band of the duplexer 30. In this example, these impedances are located in substantially the same region on the Smith charts. That is, the impedance of the duplexer 20 single unit and the impedance of the duplexer 30 single unit are designed to be equivalent to each other. Therefore, the susceptance component of the duplexer 20 single unit is equivalent to the susceptance component of the duplexer 30 single unit. Here, being "equivalent" not only includes a state in which two things are completely the same, but also includes a state in which there is some difference between two things.

In a state in which the duplexers 20 and 30 having the characteristics described above are tied together, characteristics described below are exhibited.

Figure 9E:
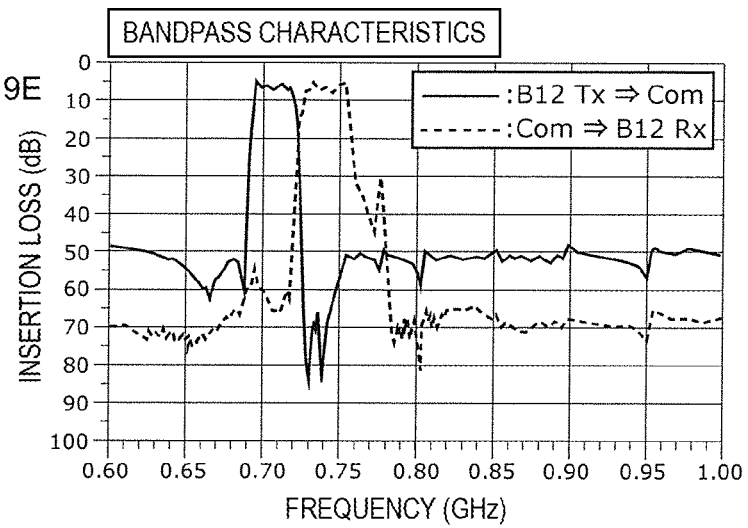
FIGS. 9E to 9G include second diagrams illustrating characteristics in a state in which two duplexers are tied together in the example.
Figure 9F:
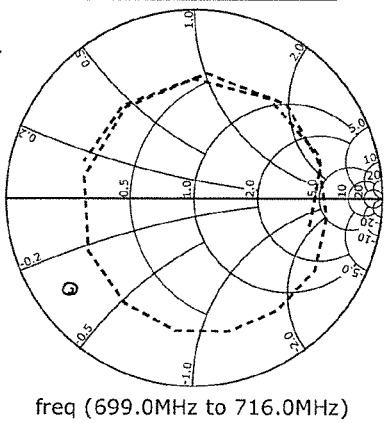
Figure 9G:
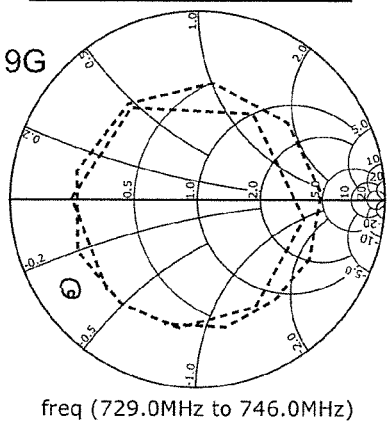

FIGS. 9A to 9G are diagrams illustrating characteristics in the state in which the duplexers 20 and 30 are tied together in an example. Specifically, FIG. 9A is a configuration diagram of a state in which the common terminals of the duplexers 20 and 30 (that is, the B26 Com terminal 102Com and the B12 Com terminal 103Com) are tied together. FIG. 9B is a graph indicating the bandpass characteristics of the duplexer 20 in the state in which the common terminals of the duplexers 20 and 30 are tied together, and the insertion loss between the B26 Tx terminal 102Tx and a Com terminal 101Com (a solid line in the graph) and the insertion loss between the Com terminal 101Com and the B26 Rx terminal 102Rx (a broken line in the graph) are illustrated. FIG. 9C is a Smith chart indicating the impedance characteristics of the Com terminal 101Com in the B26 Tx band (a solid line in the chart) and the impedance characteristics of the B26 Tx terminal 102Tx in the B26 Tx band (a broken line in the chart). FIG. 9D is a Smith chart indicating the impedance characteristics of the Com terminal 101Com in the B26 Rx band (a solid line in the chart) and the impedance characteristics of the B26 Rx terminal 102Rx in the B26 Rx band (a broken line in the chart). FIG. 9E is a graph indicating the bandpass characteristics of the duplexer 30 in the state in which the common terminals of the duplexers 20 and 30 are tied together, and the insertion loss between the B12 Tx terminal 103Tx and the Com terminal 101Com (a solid line in the graph) and the insertion loss between the Com terminal 101Com and the B12 Rx terminal 103Rx (a broken line in the graph) are illustrated. FIG. 9F is a Smith chart indicating the impedance characteristics of the Com terminal 101Com in the B12 Tx band (a solid line in the chart) and the impedance characteristics of the B12 Tx terminal 103Tx in the B12 Tx band (a broken line in the chart). FIG. 9G is a Smith chart indicating the impedance characteristics of the Com terminal 101Com in the B12 Rx band (a solid line in the chart) and the impedance characteristics of the B12 Rx terminal 103Rx in the B12 Rx band (a broken line in the chart). In this example, the Com terminal 101Com mentioned above is a terminal at which the B26 Com terminal 102Com of the duplexer 20 and the B12 Com terminal 103Com of the duplexer 30 are tied together (common-connected).

As illustrated in FIGS. 9A to 9G, the impedance in the case where the common terminals of the duplexers 20 and 30 are tied together, specifically, the impedance when viewed from the Com terminal 101Com, exhibits capacitive characteristics in both Band 26 within the pass band of the duplexer 20 and Band 12 within the pass band of the duplexer 30. Specifically, the impedance is located in a region shifted clockwise on an equal-conductance circle (not illustrated) relative to the impedance of the duplexer 20 single unit (see FIGS. 7C and 7D) and the impedance of the duplexer 30 single unit (see FIGS. 8C and 8D). That is, the impedance in the state in which the duplexers are tied together includes a susceptance component corresponding to the total sum of a susceptance component of the duplexer 20 single unit and a susceptance component of the duplexer 30 single unit.

In the radio frequency front end circuit according to this example having such characteristics, the capacitance value of the capacitor C (first impedance element) is set to 5.8 pF, and the inductance value of the inductor L (second impedance element) is set to 3.7 nH.

Regarding the characteristics of the radio frequency front end circuit according to this example, characteristics in the case where multiple devices (in this example, the duplexers 20 and 30) are selected (that is, characteristics at the time of CA between Band 26 and Band 12) and characteristics in the case where a single device is selected (that is, characteristics at the time of non-CA for Band 26 and characteristics at the time of non-CA for Band 12) will be explained below.

FIGS. 10A to 10G are diagrams illustrating characteristics at the time of CA between Band 26 and Band 12 in a radio frequency front end circuit according to an example. Specifically, FIG. 10A is a configuration diagram of the radio frequency front end circuit according to this example when such characteristics are obtained. In FIG. 10A, both the main switch SW1 and the main switch SW2 are ON, and both the sub-switch SW1g and the sub-switch SW2g are OFF. FIG. 10B is a graph indicating the bandpass characteristics of the radio frequency front end circuit according to this example at this time, and the insertion loss between the B26 Tx terminal 102Tx and the ANT terminal 101 (a solid line in the graph) and the insertion loss between the ANT terminal 101 and the B26 Rx terminal 102Rx (a broken line in the graph) are illustrated. FIG. 10C is a Smith chart indicating the impedance characteristics of the ANT terminal 101 in the B26 Tx band (a solid line in the chart) and the impedance characteristics of the B26 Tx terminal 102Tx in the B26 Tx band (a broken line in the chart). FIG. 10D is a Smith chart indicating the impedance characteristics of the ANT terminal 101 in the B26 Rx band (a solid line in the chart) and the impedance characteristics of the B26 Rx terminal 102Rx in the B26 Rx band (a broken line in the chart). FIG. 10E is a graph indicating the bandpass characteristics of the radio frequency front end circuit according to this example at this time, and the insertion loss between the B12 Tx terminal 103Tx and the ANT terminal 101 (a solid line in the graph) and the insertion loss between the ANT terminal 101 and the B12 Rx terminal 103Rx (a broken line in the graph) are illustrated. FIG. 10F is a Smith chart indicating the impedance characteristics of the ANT terminal 101 in the B12 Tx band (a solid line in the chart) and the impedance characteristics of the B12 Tx terminal 103Tx in the B12 Tx band (a broken line in the chart). FIG. 10G is a Smith chart indicating the impedance characteristics of the ANT terminal 101 in the B12 Rx band (a solid line in the chart) and the impedance characteristics of the B12 Rx terminal 103Rx in the B12 Rx band (a broken line in the chart).

As illustrated in FIGS. 10A to 10G, in the radio frequency front end circuit according to this example, in the case where the duplexers 20 and 30 are selected, each of the ANT terminal 101, the B26 Tx terminal 102Tx, the B26 Rx terminal 102Rx, the B12 Tx terminal 103Tx, and the B12 Rx terminal 103Rx is made to match 50Ω, which is a standardized impedance.

FIGS. 11A to 11D include diagrams illustrating characteristics at the time of non-CA for Band 26 in a radio frequency front end circuit according to an example. Specifically, FIG. 11A is a configuration diagram of the radio frequency front end circuit according to this example when such characteristics are obtained. In FIG. 11A, the main switch SW1 is ON, the sub-switch Sw1g is OFF, the main switch SW2 is OFF, and the sub-switch SW2g is ON. FIG. 11B is a graph indicating the bandpass characteristics of the radio frequency front end circuit according to this example at this time, and the insertion loss between the B26 Tx terminal 102Tx and the ANT terminal 101 (a solid line in the graph) and the insertion loss between the ANT terminal 101 and the B26 Rx terminal 102Rx (a broken line in the graph) are illustrated. FIG. 11C is a Smith chart indicating the impedance characteristics of the ANT terminal 101 in the B26 Tx band (a solid line in the chart) and the impedance characteristics of the B26 Tx terminal 102Tx in the B26 Tx band (a broken line in the chart). FIG. 11D is a Smith chart indicating the impedance characteristics of the ANT terminal 101 in the B26 Rx band (a solid line in the chart) and the impedance characteristics of the B26 Rx terminal 102Rx in the B26 Rx band (a broken line in the chart).

FIGS. 11E to 11H include diagrams illustrating the characteristics at the time of non-CA for Band 12 in a radio frequency front end circuit according to an example. In FIGS. 11E to 11H, the main switch SW1 is OFF, the sub-switch Swig is ON, the main switch SW2 is ON, and the sub-switch SW2g is OFF. Specifically, FIG. 11E is a configuration diagram of the radio frequency front end circuit according to this example when such characteristics are obtained. FIG. 11F is a graph indicating the bandpass characteristics of the radio frequency front end circuit according to this example at this time, and the insertion loss between the B12 Tx terminal 103Tx and the ANT terminal 101 (a solid line in the graph) and the insertion loss between the ANT terminal 101 and the B12 Rx terminal 103Rx (a broken line in the graph) are illustrated. FIG. 11G is a Smith chart indicating the impedance characteristics of the ANT terminal 101 in the B12 Tx band (a solid line in the chart) and the impedance characteristics of the B12 Tx terminal 103Tx in the B12 Tx band (a broken line in the chart). FIG. 11H is a Smith chart indicating the impedance characteristics of the ANT terminal 101 in the B12 Rx band (a solid line in the chart) and the impedance characteristics of the B12 Rx terminal 103Rx in the B12 Rx band (a broken line in the chart).

As illustrated in FIGS. 11A to 11D, at the time of non-CA for Band 26 in which the duplexer 20 supporting Band 26 is selected, each of the ANT terminal 101, the B26 Tx terminal 102Tx and the B26 Rx terminal 102Rx is made to match 50Ω, which is a standardized impedance. Furthermore, as illustrated in FIG. 11E to 11H, at the time of non-CA for Band 12 in which the duplexer 30 supporting Band 12 is selected, each of the ANT terminal 101, the B12 Tx terminal 103Tx, and the B12 Rx terminal 103Rx is made to match 50Ω, which is the standardized impedance.

3. Effects Etc.

As described above, the radio frequency front end circuit 1 according to this embodiment includes the capacitor C (first impedance element) that allows connection between the selection terminal 112 (first selection terminal) and the selection terminal 113 (second selection terminal).

Accordingly, in the case where the switch circuit 10 is in the first connection form (in this embodiment, in the case where a single device is selected) in which only one of the main switch SW1 (first main switch) and the main switch SW2 (second main switch) is ON, the capacitor C is connected to the ground with one of the sub-switch Swig (first sub-switch) and the sub-switch SW2g (second sub-switch) interposed therebetween. Therefore, at this time, the capacitor C operates as an impedance element of an impedance matching circuit. In contrast, in the case where the switch circuit 10 is in the second connection form (in this example, multiple devices are selected) in which both the main switches SW1 and SW2 are ON, the ends of the capacitor C are short-circuited with the main switch SW1 and the main switch SW2 interposed therebetween. Therefore, at this time, the capacitor C does not operate. That is, according to this embodiment, an impedance matching circuit can be changed according to the connection form of the switch circuit, without adding an impedance element serving as an impedance matching circuit. Therefore, a reduction in size and minimization of loss can be achieved.

The capacitor C causes the impedance of the ANT terminal 101 to match the standardized impedance only when the switch circuit 10 is in the first connection form. Accordingly, being able to switch between matching and mismatching by the capacitor C according to whether the switch circuit 10 is in the first connection form or the second connection form is equivalent to configuring two impedance matching circuits using a single impedance element (in this case, the capacitor C). Therefore, the number of elements forming an impedance matching circuit can be reduced, and a reduction in size can thus be achieved.

Furthermore, the radio frequency front end circuit 1 according to this embodiment further includes the inductor L (second impedance element) that allows connection between the common terminal 111 and the ground.

Accordingly, in the case where the switch circuit 10 is in the first connection form, the impedance matching circuit that includes a parallel circuit including the capacitor C and the inductor L causes the impedance of the ANT terminal 101 to match the standardized impedance. In the case where the switch circuit 10 is in the second connection form, the impedance matching circuit that includes the inductor L causes the impedance of the ANT terminal 101 to match the standardized impedance. Therefore, minimization of loss can be achieved regardless of whether the switch circuit 10 is in the first connection form or the second connection form.

Furthermore, in the radio frequency front end circuit 1 according to this embodiment, the duplexer 20 (first filter) and the duplexer 30 (second filter) are acoustic wave filters, and therefore, the compact and low-profile duplexers 20 and 30 having filter characteristics with excellent steepness (high selectivity) can be attained. That is, according to this embodiment, the low-loss, high-selectivity radio frequency front end circuit 1 can be attained while a further reduction in size is achieved.

Furthermore, in the radio frequency front end circuit 1 according to this embodiment, the first impedance element is the capacitor C, and the second impedance element is the inductor L. In acoustic wave filters configuring the duplexer 20 (first filter) and the duplexer 30 (second filter), the impedance often exhibits capacitive characteristics, in terms of structure. Therefore, with the use of the capacitor C as the first impedance element and the use of the inductor L as the second impedance element, the impedance of the ANT terminal 101 can be made to match the standardized impedance, regardless of whether the switch circuit 10 is in the first connection form or the second connection form. Thus, minimization of loss can be achieved. That is, according to this embodiment, the radio frequency front end circuit 1 with low loss and high selectivity can be attained while a reduction in size is achieved.

Furthermore, in the radio frequency front end circuit 1 according to this embodiment, a susceptance component within the pass band of the duplexer 20 (first filter) single unit when viewed from the selection terminal 112 and a susceptance component within the pass band of the duplexer 30 (second filter) single unit when viewed from the selection terminal 113 are equivalent to each other. Accordingly, addition of the capacitor C (first impedance element) allows the impedance at the ANT terminal 101 to be shifted to substantially the same position on a Smith chart between the first connection form of the switch circuit 10 in which only the main switch SW1 is ON and the first connection form of the switch circuit 10 in which only the main switch SW2 is ON. That is, the admittance at the ANT terminal 101 can be shifted to substantially the same position on an admittance chart. Therefore, by appropriately adjusting the constant of the capacitor C, the impedance at the ANT terminal 101 can be made to match the standardized impedance in any of the cases mentioned above. Accordingly, an increase in the number of components can be suppressed, and a further reduction in size can thus be achieved.

Furthermore, in the radio frequency front end circuit 1 according to this embodiment, at least one of the duplexer 20 and the duplexer 30 (in this embodiment, both the duplexers 20 and 30) includes multiple filters. Therefore, for example, a radio frequency front end circuit for transmission and reception supporting CA can be achieved.

First Modification of First Embodiment

In the embodiment described above, each of the first filter and the second filter is a duplexer. Therefore, a susceptance component within the pass band of the first filter single unit and a susceptance component within the pass band of the second filter single unit may be designed to be equivalent to each other. In contrast, in a modification, the first filter includes a single filter, and the second filter is a duplexer including two filters. Therefore, in the case where each of the first filter and the second filter is configured as an acoustic wave filter, it is difficult to design a susceptance component within the pass band of the first filter single unit and a susceptance component within the pass band of the second filter single unit to be equivalent to each other, and the susceptance component of the first filter unit is smaller than the susceptance component of the second filter single unit. In this modification, such a radio frequency front end circuit will be explained.

Figure 12:
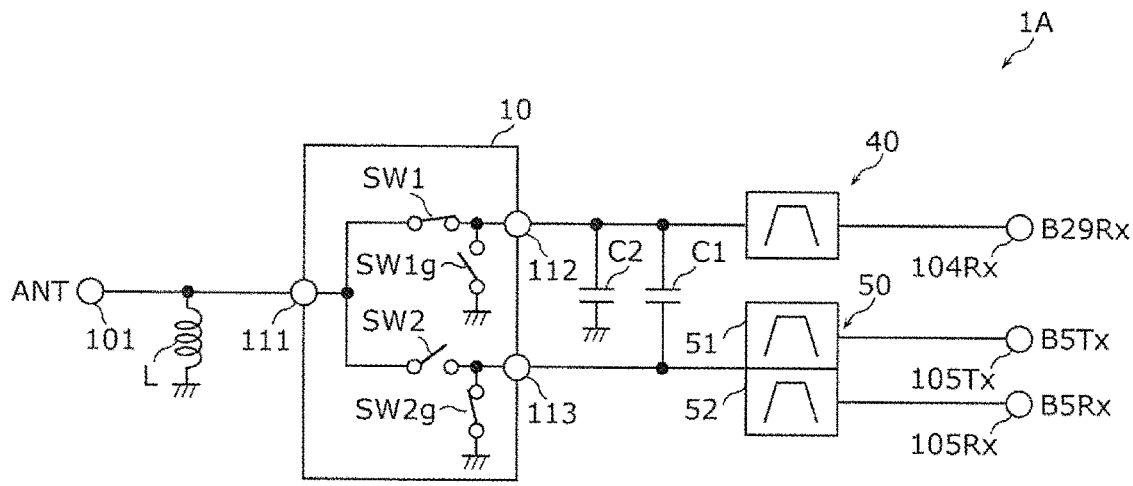
FIG. 12 is a configuration diagram of a radio frequency front end circuit according to a first modification of the first embodiment.

FIG. 12 is a configuration diagram of a radio frequency front end circuit 1A according to a first modification of the first embodiment.

The radio frequency front end circuit 1A illustrated in FIG. 12 is different from the radio frequency front end circuit 1 according to the embodiment described above in that the radio frequency front end circuit 1A supports Band 29, which is a Band dedicated to reception, in place of Band 26, and supports Band 5 that is capable of CA with Band 29, in place of B12. Therefore, the radio frequency front end circuit 1A includes a filter 40 that supports Band 29 as the first filter, in place of the duplexer 20 supporting Band 26, and a duplexer 50 that supports Band 5 as the second filter, in place of the duplexer 30 supporting Band 12.

The filter 40 is a reception filter that includes the Rx band of Band 29 as the pass band. One of input and output terminals (in this case, the input terminal) of the filter 40 is connected to the selection terminal 112 of the switch circuit 10, and the other one of the input and output terminals (in this case, the output terminal) is connected to a B29 Rx terminal 104Rx.

The duplexer 50 includes a transmission filter 51 that includes the Tx band of Band 5 as the pass band and the Rx band of Band 5 as the attenuation band and a reception filter 52 that includes the Rx band of Band 5 as the pass band and the Tx band of Band 5 as the attenuation band. One of input and output terminals (in this case, the output terminal) of the transmission filter 51 and one of input and output terminals (in this case, the input terminal) of the reception filter 52 are common-connected (tied together) at a common terminal of the duplexer 50 and is connected to the selection terminal 113 of the switch circuit 10. Furthermore, the other one of the input and output terminals (in this case, the input terminal) of the transmission filter 51 is connected to a B5 Tx terminal 105Tx. Furthermore, the other one of the input and output terminals (in this case, the output terminal) of the reception filter 52 is connected to a B5 Rx terminal 105Rx.

In this embodiment, each of the filter 40 and the duplexer 50 (a first filter and a second filter) is an acoustic wave filter including an acoustic wave resonator. Specifically, each of the transmission filter 51 and the reception filter 52 forming the duplexer 50 is an acoustic wave filter. Therefore, a susceptance component of the filter 40 single unit including a single acoustic wave filter is smaller than a susceptance component of the duplexer 50 single unit including two acoustic wave filters.

Thus, the radio frequency front end circuit 1A according to this modification further includes a capacitor C2 (third impedance element) that allows connection between the selection terminal 112 (first selection terminal) and the ground, in addition to a capacitor C1 (first impedance element) that corresponds to the capacitor C in the first embodiment. The capacitor C2, together with the inductor L or together with the capacitor C2, configures an impedance matching circuit that causes the impedance of the ANT terminal 101 to match the standardized impedance. This configuration will be described in detail below with reference to FIGS. 13A to 15B.

Figure 13A:
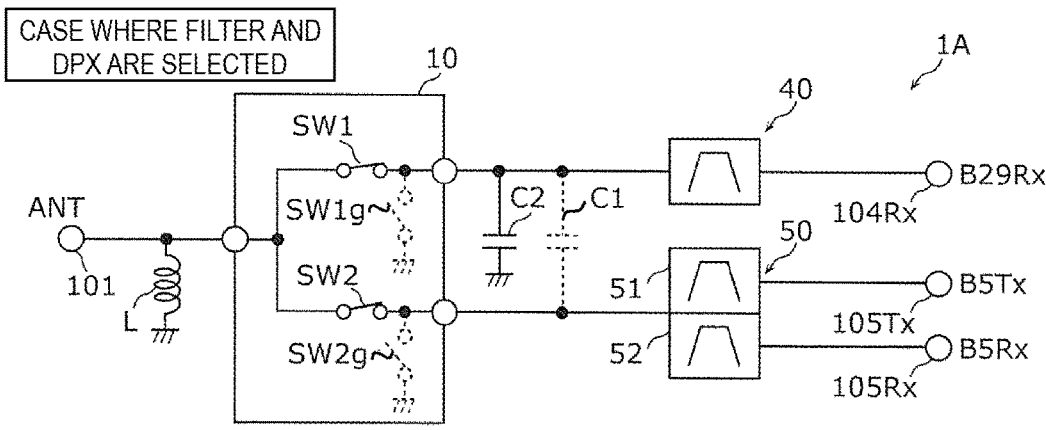
FIG. 13A is a diagram schematically illustrating a configuration of the radio frequency front end circuit according to the first modification of the first embodiment in the case where multiple devices are selected.
Figure 13B:
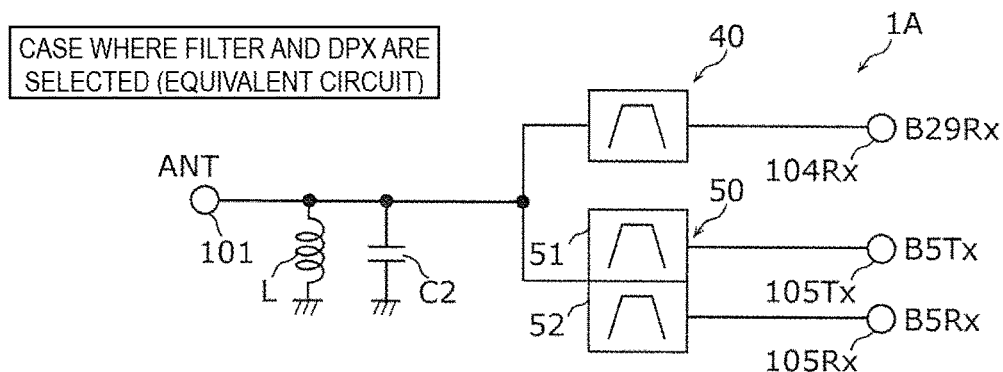
FIG. 13B is an equivalent circuit diagram of FIG. 13A.

FIG. 13A is a diagram schematically illustrating a configuration of the radio frequency front end circuit 1A according to this modification in the case where multiple devices (in this case, the filter 40 and the duplexer 50) are selected. FIG. 13B is an equivalent circuit diagram of FIG. 13A.

As illustrated in FIGS. 13A and 13B, in the case where the filter 40 and the duplexer 50 are selected, the ends of the capacitor C1 are short-circuited with the main switches SW1 and SW2 interposed therebetween. Therefore, in such a case, the capacitor C1 does not operate, and terminals on the ANT terminal 101 side of the selected filter 40 and duplexer 50 are connected to the ground by a parallel circuit including the inductor L (second impedance element) and the capacitor C2 (third impedance element). That is, in the case where the switch circuit 10 is in the second connection form (that is, both the main switches SW1 and SW2 are ON), the parallel circuit including the inductor L and the capacitor C2 causes the impedance of the ANT terminal 101 to match the standardized impedance. In other words, at this time, the parallel circuit mentioned above configures an impedance matching circuit.

Figure 14A:
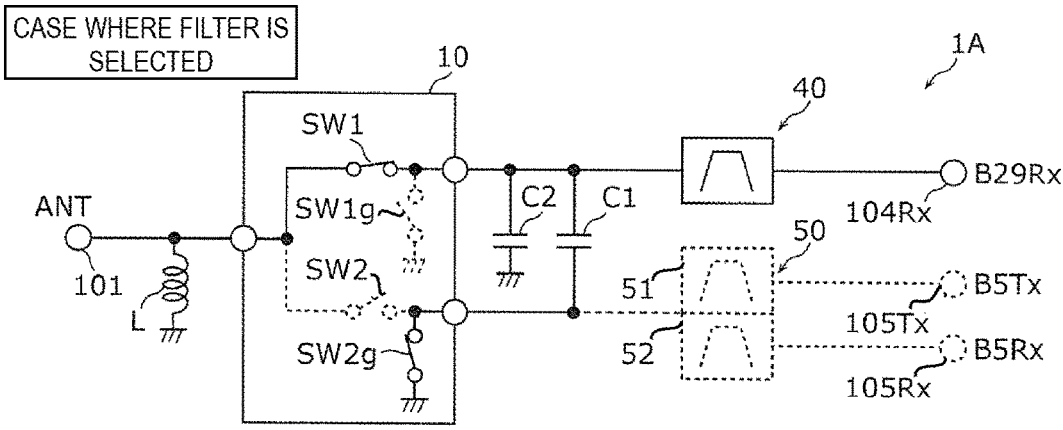
FIG. 14A is a diagram schematically illustrating a configuration of the radio frequency front end circuit according to the first modification of the first embodiment in the case where a filter is selected as a single device.
Figure 14B:
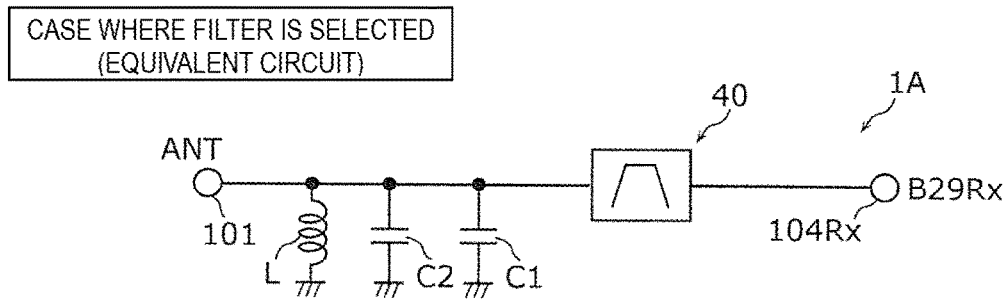
FIG. 14B is an equivalent circuit diagram of FIG. 14A.

FIG. 14A is a diagram schematically illustrating a configuration of the radio frequency front end circuit 1A according to this modification in the case where the filter 40 (first filter) is selected as a single device. FIG. 14B is an equivalent circuit diagram of FIG. 14A.

As illustrated in FIGS. 14A and 14B, in the case where only the filter 40 is selected, the capacitor C1 is connected to the ground with the sub-switch SW2g associated with the duplexer 50, which is not selected, interposed therebetween. Therefore, in such a case, the terminal on the ANT terminal 101 side of the selected filter 40 is connected to the ground by a parallel circuit including the capacitor C1 (first impedance element), the capacitor C2 (third impedance element), and the inductor L (second impedance element). That is, in the case where the switch circuit 10 is in the first connection form in which only the main switch SW1 (first main switch) is ON, the parallel circuit including the capacitor C1, the capacitor C2, and the inductor L causes the impedance of the ANT terminal 101 to match the standardized impedance. In other words, at this time, the parallel circuit mentioned above configures an impedance matching circuit.

Figure 15A:
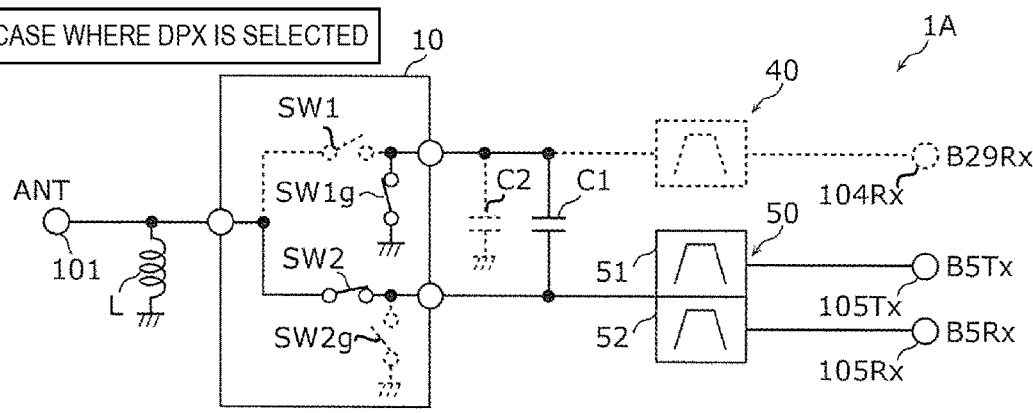
FIG. 15A is a diagram schematically illustrating a configuration of the radio frequency front end circuit according to the first modification of the first embodiment in the case where a duplexer is selected as a single device.
Figure 15B:
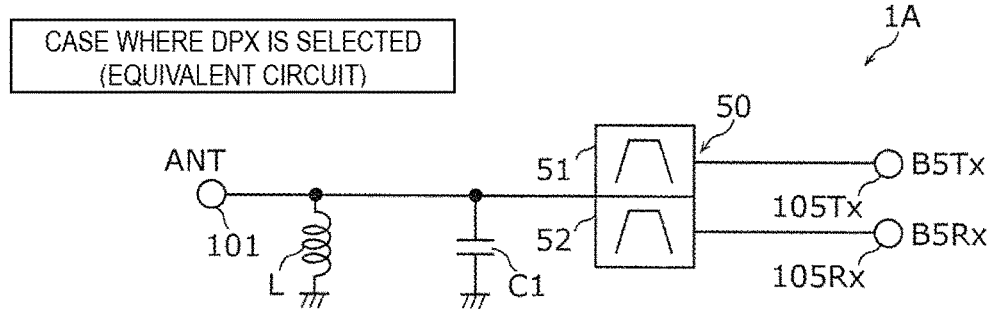
FIG. 15B is an equivalent circuit diagram of FIG. 15A.

FIG. 15A is a diagram schematically illustrating a configuration of the radio frequency front end circuit 1A according to this modification in the case where the duplexer 50 (second filter) is selected as a single device. FIG. 15B is an equivalent circuit diagram of FIG. 15A.

As illustrated in FIGS. 15A and 15B, in the case where only the duplexer 50 is selected, the capacitor C1 is connected to the ground with the sub-switch Swig associated with the filter 40, which is not selected, interposed therebetween. Therefore, in such a case, a terminal on the ANT terminal 101 side of the selected duplexer 50 is connected to the ground by a parallel circuit including the capacitor C1 (first impedance element) and the inductor L (second impedance element). That is, in the case where the switch circuit 10 is in the first connection form in which only the main switch SW2 (second main switch) is ON, the parallel circuit including the capacitor C1 and the inductor L causes the impedance of the ANT terminal 101 to match the standardized impedance. In other words, at this time, the parallel circuit mentioned above configures an impedance matching circuit.

As described above, according to this modification, impedance matching (an impedance matching circuit) can be changed among the case where multiple devices are selected, the case where the first filter is selected as a single device, and the case where the second filter is selected as a single device.

The principle of impedance matching in this modification will be explained below.

Figure 16:
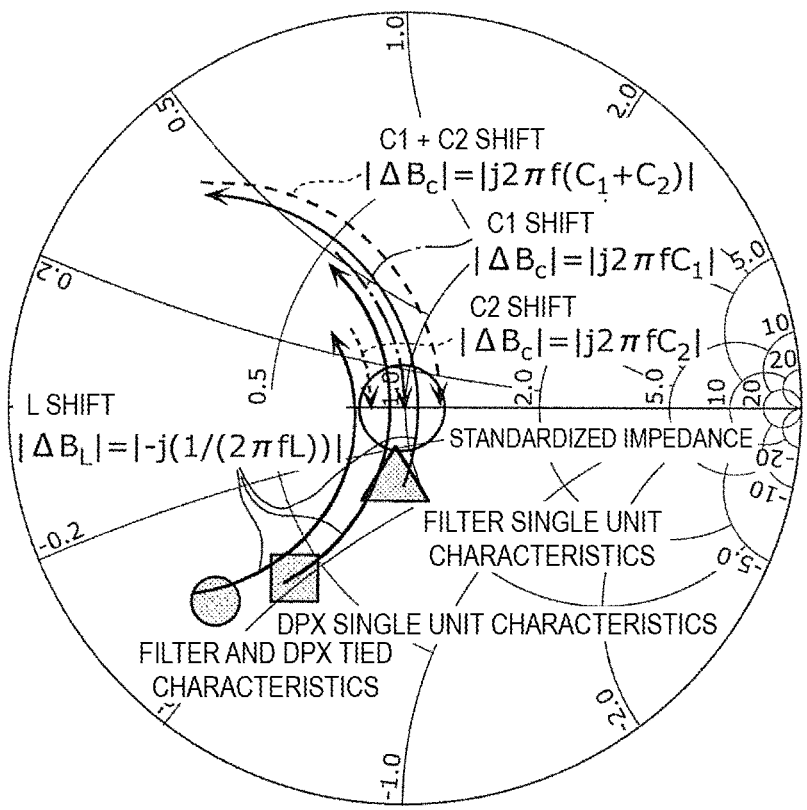
FIG. 16 is a Smith chart for explaining impedance matching in the first modification of the first embodiment.

FIG. 16 is a Smith chart for explaining impedance matching in this modification.

In each of the filter 40 and the duplexer 50 including an acoustic wave filter, the impedance exhibits capacitive characteristics, in terms of structure, and the filter 40, which includes a single filter, exhibits less capacitive characteristics than the duplexer 50, which includes two filters (the transmission filter 51 and the reception filter 52). Specifically, the impedance of the filter 40 single unit (hereinafter, referred to as "Filter single unit characteristics") is designed as a triangular part indicated as "Filter single unit characteristics" on the Smith chart of FIG. 16. Furthermore, the impedance of the duplexer 50 single unit (hereinafter, referred to as "DPX single unit characteristics") is designed as a rectangular part indicated as "DPX single unit characteristics" on the Smith chart of FIG. 16.

Therefore, the impedance in the case where common terminals of the two filter 40 and duplexer 50 are common-connected (hereinafter, referred to as "Filter+DPX tied characteristics") is located in a circular part indicated as "Filter+DPX tied characteristics" on the Smith chart of FIG. 16.

Accordingly, susceptance components increase in the order of the "Filter single unit characteristics", which are characteristics of the configuration including a single filter, the "DPX single unit characteristics", which are characteristics of the configuration including two filters, and the "Filter+DPX tied characteristics", which are characteristics of the configuration including three filters. This is because in the own pass band (own band) of a filter, a partner filter that is tied with serves as the attenuation band, and operates as a capacitor. Accordingly, as the number of filters to be tied together increases, a susceptance component increases.

In this modification, impedance matching (an impedance matching circuit) can be changed among the case where only the filter 40 is selected, the case where only the duplexer 50 is selected, and the case where both the filter 40 and the duplexer 50 are selected. Therefore, a reduction in size can be achieved.

Specifically, capacitance values of the capacitors C1 and C2 and the inductance value of the inductor L are set, for example, to satisfy the equations provided below.

$B11+|j2\pi fC2|=|-j(1/(2\pi fL))|$ $B12+|j2\pi fC1|=|-j(1/(2\pi fL))|$ $B13+|j2\pi rf(C1+C2)|=|-j(1/(2\pi fL))|$

In the above equations, B11, $B_{12}$, and $B_{13}$ represent the susceptance value of the Filter+DPX tied characteristics, the susceptance value of the DPX single unit characteristics, and the susceptance value of the Filter single unit characteristics, in that order. Furthermore, $C_1$, $C_2$, and L represent the capacitance value of the capacitor C1, the capacitance value of the capacitor C2, and the inductance value of the inductor L, in that order. Furthermore, f represents, for example, the center frequency of the pass band. With the relationship of $B_{11}>B_{12}>B_{13}$, the relationship of $C_2<C_1$ is established.

Thus, according to this modification, an impedance matching circuit that matches three impedance states (the Filter+DPX tied characteristics, the DPX single unit characteristics, and the Filter single unit characteristics) can be configured, without adding an impedance element serving as an impedance matching circuit.

As described above, the radio frequency front end circuit 1A according to this modification includes the capacitor C1 (first impedance element) that allows connection between the selection terminal 112 (first selection terminal) and the selection terminal 113 (second selection terminal), and therefore, a reduction in size and minimization of loss can be achieved, as in the first embodiment.

Furthermore, the radio frequency front end circuit 1A according to this modification further includes the capacitor C2 (third impedance element) that allows connection between the selection terminal 112 (first selection terminal) and the ground. Therefore, even in the case where a susceptance component of the filter 40 (first filter) single unit is smaller than a susceptance component of the duplexer (second filter) single unit, the impedance matching circuit can be changed according to the connection form of the switch circuit. Thus, a reduction in size and minimization of loss can be achieved.

Such a configuration is especially useful for the case where the radio frequency front end circuit 1A have the configuration described below. That is, the switch circuit 10 includes three or more selection terminals, and the radio frequency front end circuit 1A further includes a device (for example, a multiplexer such as a duplexer) that includes a susceptance component larger than the susceptance component of the duplexer 50 single unit. In this case, no impedance element is connected to a path that connects the above-mentioned device with a selection terminal of the switch circuit 10, and the device is used (selected) only as a single unit.

With such a configuration, by setting the inductance value of the inductor L such that impedance matching can be achieved when the device is selected, the three impedance elements (the capacitor C1, the capacitor C2, and the inductor L) can configure an impedance matching circuit that matches four impedance states (the Filter+DPX tied characteristics, the DPX single unit characteristics, the Filter single unit characteristics, and the device single unit characteristics mentioned above).

In particular, in this modification, the first impedance element (capacitor C1) and the second impedance element (capacitor C2) are capacitors, and the capacitance value of the third impedance element is smaller than the capacitance element of the first impedance element. Accordingly, in the case where a susceptance component within the pass band of each of the filter 40 single unit and the duplexer 50 single unit is larger than j0, that is, in the case where each of the filter 40 single unit and the duplexer 50 single unit exhibits capacitive characteristics in the pass band thereof, a reduction in size and minimization of loss can be achieved.

Second Modification of First Embodiment

With the use of the off capacitance of the sub-switch SW1g, in place of the capacitor C2 that allows connection between the selection terminal 112 and the ground in the first modification of the first embodiment described above, similar effects can be achieved. Thus, in a modification, such a radio frequency front end circuit will be explained.

Figure 17:
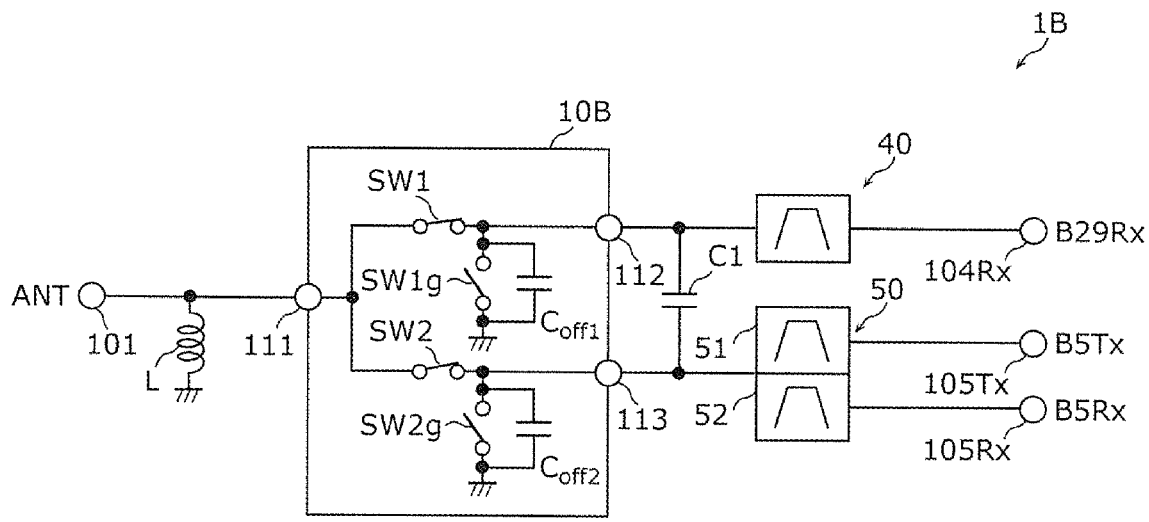
FIG. 17 is a configuration diagram of a radio frequency front end circuit according to a second modification of the first embodiment.

FIG. 17 is a configuration diagram of a radio frequency front end circuit 1B according to a second modification of the first embodiment. In FIG. 17, the off capacitance of the sub-switch SW1g (first sub-switch) and the off capacitance of the sub-switch SW2g (second sub-switch) are also illustrated. Here, the off capacitance of a switch represents the capacitance entering between switch terminals in the case where the switch is OFF. For example, the off capacitance of the sub-switch SW1g represents a capacitance generated between the first terminal connected to the selection terminal 112 and the second terminal connected to the ground in the case where the sub-switch SW1g is OFF.

The radio frequency front end circuit 1B illustrated in FIG. 17 is different from the radio frequency front end circuit 1A according to the first modification of the first embodiment described above in that the radio frequency front end circuit 1B does not include the capacitor C2 (third impedance element) and the off capacitance of the sub-switch Sw1g is larger than the off capacitance of the sub-switch SW2g.

Specifically, the capacitance value of the capacitor C1, the capacitance value of the off capacitance of the sub-switch Sw1g, the capacitance value of the off capacitance of the sub-switch SW2g, and the inductance value of the inductor L are set, for example, to satisfy the equations provided below.

$$B11+|j2\pi rf(Coff1+Coff2)|=|-j(1/(2\pi fL))|$$

$$B12+|j2\pi rf(C1+Coff2)|=|-j(1/(2\pi fL))|$$

$$B13+|j2\pi rf(C1+Coff1)|=|-j(1/(2\pi fL))|$$

In the above equations, B11, $B_{12}$, and $B_{13}$ represent the susceptance value of the Filter+DPX tied characteristics, the susceptance value of the DPX single unit characteristics, and the susceptance value of the Filter single unit characteristics, in that order. Furthermore, $C_1$, L, $C_{off1}$, and $C_{off2}$ represent the capacitance value of the capacitor C1, the inductance value of the inductor L, the capacitance value of the off capacitance of the sub-switch SW1g, and the capacitance value of the off capacitance of the sub-switch SW2g, in that order. Furthermore, f represents, for example, the center frequency of the pass band. With the relationship of $B_{11}>B_{12}>B_{13}$, the relationship of $C_{off1}<C_{off2}$ is established.

That is, according to this modification, in the case where the filter 40 and the duplexer 50 are selected, the terminals on the ANT terminal 101 side of the selected filter 40 and duplexer 50 are connected to the ground by a parallel circuit including the off capacitance of the sub-switch SW1g (first sub-switch), the off capacitance of the sub-switch SW2g (second sub-switch), and the inductor L (second impedance element). Furthermore, in the case where only the duplexer 50 is selected, the terminal on the ANT terminal 101 side of the selected duplexer 50 is connected to the ground by a parallel circuit including the capacitor C1 (first impedance element), the off capacitance of the sub-switch SW2g, and the inductor L. Furthermore, in the case where only the filter 40 is selected, the terminal on the ANT terminal 101 side of the selected filter 40 is connected to the ground by a parallel circuit including the capacitor C1, the off capacitance of the sub-switch SW1g, and the inductor L.

Also, with the radio frequency front end circuit 1B according to this modification configured as described above, effects similar to those in the first modification of the first embodiment described above can be achieved. That is, impedance matching (an impedance matching circuit) can be changed among the case where only the filter 40 is selected, the case where only the duplexer 50 is selected, and the case where both the filter 40 and the duplexer 50 are selected, without adding an impedance element serving as an impedance matching circuit.

Furthermore, with the radio frequency front end circuit 1B according to this modification, the off capacitance of the sub-switch SW1g (first sub-switch) is larger than the off capacitance of the sub-switch SW2g (second sub-switch). Therefore, effects similar to those in the first modification of the first embodiment described above can be achieved while the number of impedance elements is reduced. Thus, a further reduction in size can be achieved.

Second Embodiment

The configurations of the radio frequency front end circuits explained above in the first embodiment and the modifications thereof may be applied to a radio frequency front end circuit that supports further multiple bands.

Figure 18:
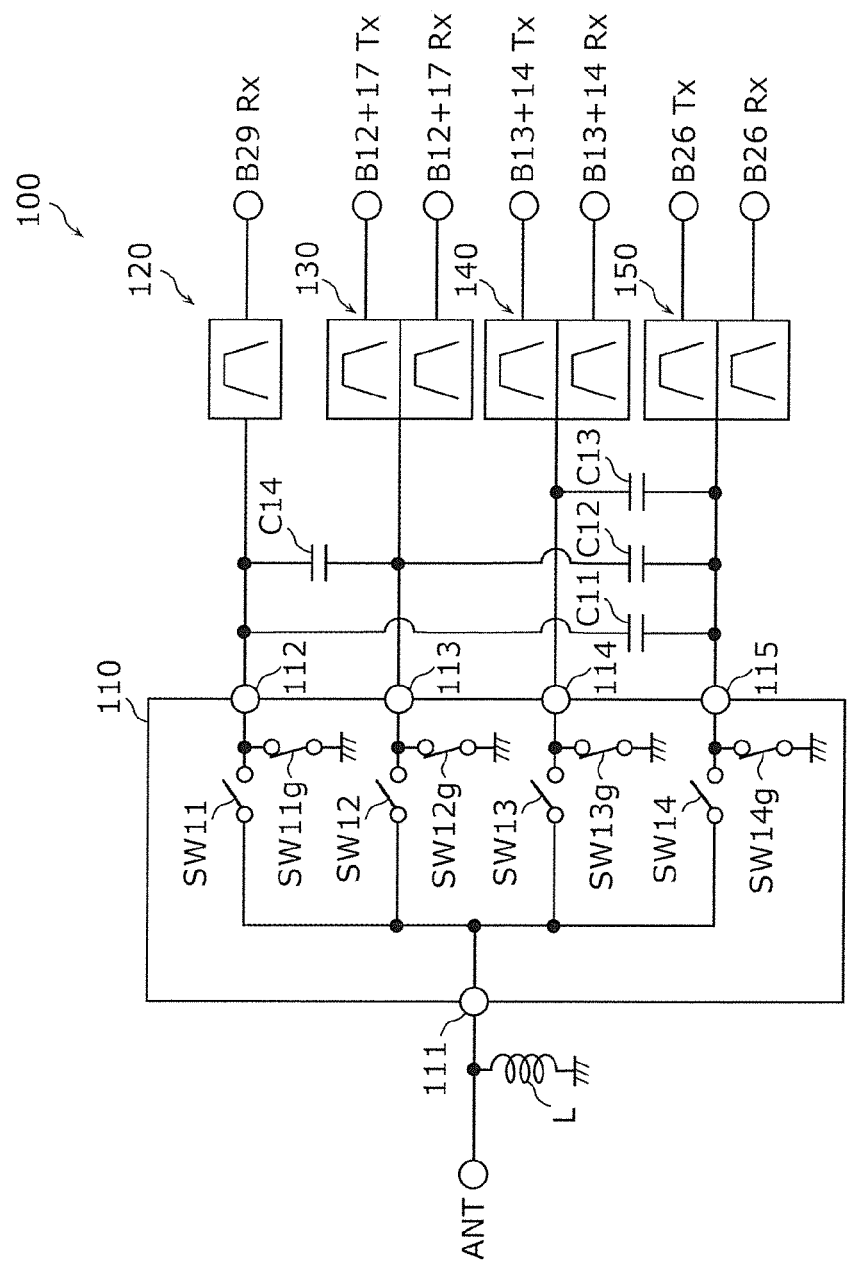
FIG. 18 is a configuration diagram of a radio frequency front end circuit according to a second embodiment.

FIG. 18 is a configuration diagram of a radio frequency front end circuit 100 according to a second embodiment.

The radio frequency front end circuit 100 illustrated in FIG. 18 includes a switch circuit 110 that includes the common terminal 111 and selection terminals 112 to 115, a filter 120, duplexers 130, 140, and 150, the inductor L (second impedance element), and capacitors C11 to C14 (first impedance element).

The filter 120 includes the Rx band of Band 29 in the pass band, and is connected to the selection terminal 112. The duplexer 130 includes the Tx band and the Rx band of Bands 12 and 17 in the pass band, and is connected to the selection terminal 113. The duplexer 140 includes the Tx band and the Rx band of Bands 13 and 14 in the pass band, and is connected to the selection terminal 114. The duplexer 150 includes the Tx band and the Rx band of Band 26 in the pass band, and is connected to the selection terminal 115.

The capacitor C11 allows connection between the selection terminal 112 and the selection terminal 115, the capacitor C12 allows connection between the selection terminal 113 and the selection terminal 115, the capacitor C13 allows connection between the selection terminal 114 and the selection terminal 115, and the capacitor C14 allows connection between the selection terminal 112 and the selection terminal 113.

The switch circuit 110 includes main switches SW11 to SW14 that are associated with the selection terminals 112 to 115, respectively, and switch between connection and non-connection between the respective selection terminals 112 to 115 and the common terminal 111 according to ON and OFF. Furthermore, the switch circuit 110 also includes sub-switches SW11g to SW14g that are associated with the selection terminals 112 to 115, respectively, and switch between connection and non-connection between the respective selection terminals 112 to 115 and the ground according to exclusive ON and OFF relative to the corresponding main switches.

Also, with the radio frequency front end circuit 100 according to this embodiment configured as described above, effects similar to those in the first embodiment described above can be achieved. That is, also in the radio frequency front end circuit 100 that includes three or more devices (in this embodiment, four devices: the filter 120 and the duplexers 130, 140, and 150), with the provision of the first impedance (in this embodiment, the capacitors C11 to C14) that allows connection between desired two selection terminals among three or more selection terminals (in this embodiment, the four selection terminals 112 to 115), an impedance matching circuit can be changed according to the connection form of the switch circuit 110, without adding an impedance element serving as an impedance matching circuit. Therefore, a reduction in size and minimization of loss can be achieved.

Third Embodiment

The radio frequency front ends circuits explained above in the first and second embodiments and the modifications thereof may include, as at least one filter, a tunable filter for which the frequency of the pass band, the attenuation band, or the like can be varied.

Figure 19:
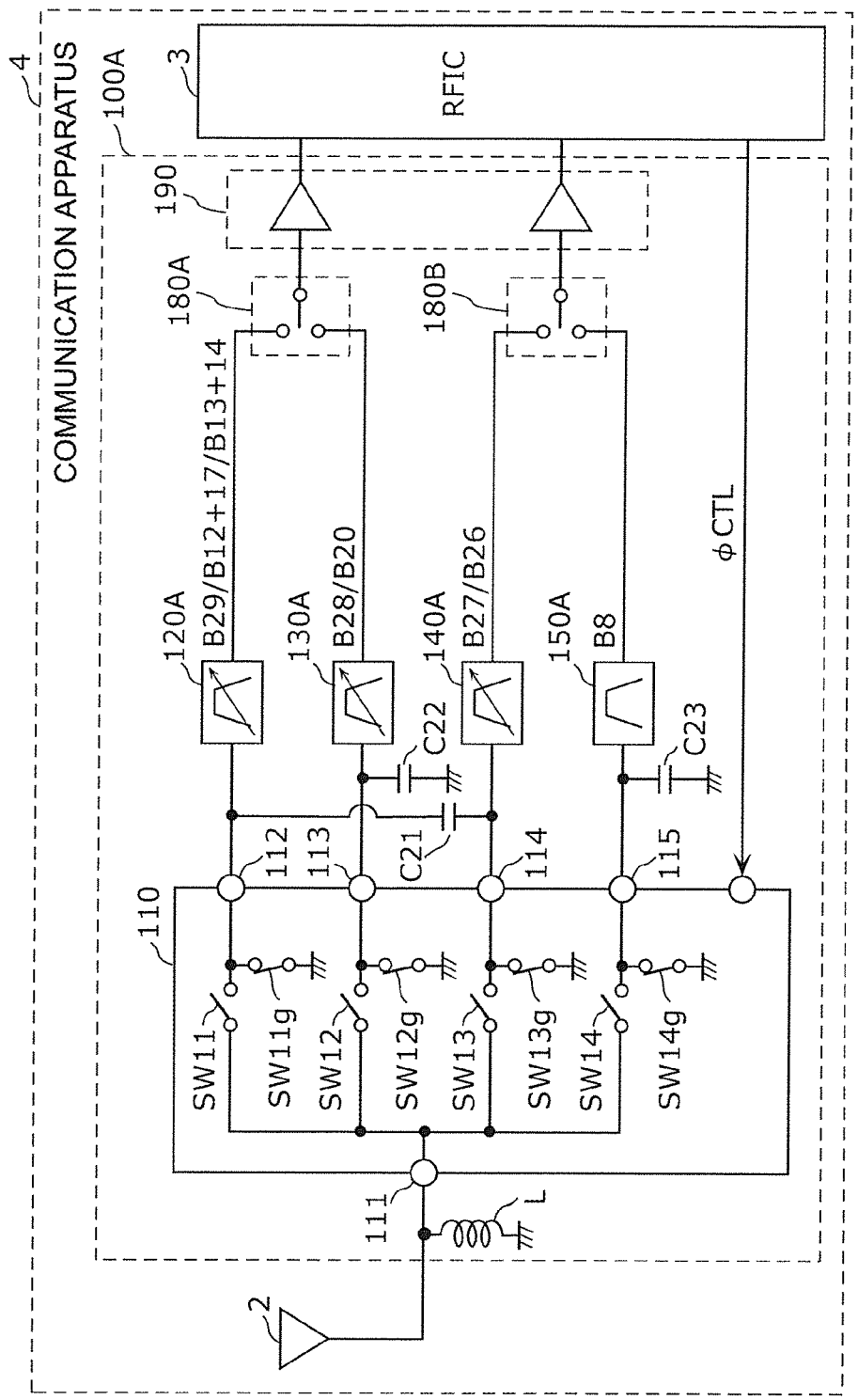
FIG. 19 is a configuration diagram of a radio frequency front end circuit according to a third embodiment and peripheral circuits thereof.

FIG. 19 is a configuration diagram of a radio frequency front end circuit 100A according to a third embodiment and peripheral circuits thereof. In FIG. 19, the radio frequency front end circuit 100A, an antenna element 2, and an RF signal processing circuit (RFIC) 3 are illustrated. The radio frequency front end circuit 100A, the antenna element 2, and the RFIC 3 form a communication apparatus 4. The antenna element 2, the radio frequency front end circuit 100A, and the RFIC 3 are, for example, arranged in a front end unit of a cellular phone that supports multiple modes/multiple bands.

The antenna element 2 is an antenna that supports multiple bands conforming to communication standards, such as, for example, LTE, in which transmission and reception of radio frequency signals is performed. For example, the antenna element 2 may not support all the bands of the communication apparatus 4 and may support only bands of a low-frequency band group or a radio frequency band group. Furthermore, the antenna element 2 may not be built in the communication apparatus 4. The antenna element 2 may be provided separately from the communication apparatus 4.

The RFIC 3 is an RF signal processing circuit that processes a radio frequency signal transmitted and received at the antenna element 2. Specifically, the RFIC 3 performs signal processing, by down conversion or the like, on a radio frequency reception signal inputted through a reception-side signal path of the radio frequency front end circuit 100A from the antenna element 2, and outputs a reception signal generated by the signal processing to a baseband signal processing circuit (not illustrated). Furthermore, the RFIC 3 performs signal processing, by up conversion or the like, on a transmission signal inputted from the baseband signal processing circuit, and outputs a radio frequency transmission signal generated by the signal processing to a transmission-side signal path (not illustrated) of the radio frequency front end circuit 100A.

The radio frequency front end circuit 100A is a circuit that transmits a radio frequency signal between the antenna element 2 and the RFIC 3. Specifically, the radio frequency front end circuit 100A transmits a radio frequency transmission signal outputted from the RFIC 3 to the antenna element 2 through the transmission-side signal path (not illustrated). Furthermore, the radio frequency front end circuit 100A transmits a radio frequency reception signal received at the antenna element 2 to the RFIC 3 through the reception-side signal path.

The radio frequency front end circuit 100A includes the inductor L (second impedance element), the switch circuit 110, filters 120A, 130A, 140A, and 150A, switches 180A and 180B, and a reception amplification circuit group 190 in that order from the antenna element 2 side. Furthermore, the radio frequency front end circuit 100A also includes a capacitor C21 (first impedance element) and capacitors C22 and C23 (third impedance element).

In this embodiment, the switch circuit 110 turns on and off the main switches SW11 to SW14 and the sub-switches SW11g to SW14g in accordance with a control signal φCTL from the RFIC 3. That is, in this embodiment, the RFIC 3 functions as a controller that causes the switch circuit 110 to enter a second connection form (two or more main switches are turned ON at the same time) for CA and to enter a first connection form (only one main switch is turned ON) for non-CA. The controller may be provided separately from the RFIC 3.

The filters 120A, 130A, and 140A are each configured as a tunable filter, and the filter 150A is configured as a filter with a fixed frequency. Specifically, the filter 120A is a tunable filter that is able to support radio frequency reception signals of (i) Band 29, (ii) Bands 12 and 17, or (iii) Bands 13 and 14, and is connected to the selection terminal 112. The filter 130A is a tunable filter that is able to support radio frequency reception signals of (i) Band 28 or (ii) Band 20, and is connected to the selection terminal 113. The filter 140A is a tunable filter that is able to support radio frequency reception signals of (i) Band 27 or (ii) Band 26, and is connected to the selection terminal 114. The filter 150A is a filter with a fixed frequency that supports radio frequency reception signals of Band 8, and is connected to the selection terminal 115.

The switches 180A and 180B are each configured as one or more switches (in this embodiment, a plurality of switches) that allow connection between a filter supporting a specific band and a reception amplification circuit supporting the specific band out of the reception amplification circuit group 190, in accordance with a control signal from the controller (not illustrated). The number of filters connected to the reception amplification circuit is not necessarily one, and multiple filters may be connected to the reception amplification circuit.

The reception amplification circuit group 190 is configured as one or more low-noise amplifiers (in this embodiment, a plurality of low-noise amplifiers) that power-amplify radio frequency reception signals inputted from the switches 180A and 180B.

The radio frequency front end circuit 100A configured as described above may perform filtering, with a specific filter, on a radio frequency reception signal inputted from the antenna element 2, amplify the filtered signal with a specific low-noise amplifier, and output the amplified signal to the RFIC 3. An RFIC that supports a low band and an RFIC that supports a high band may be provided separately.

The capacitor C21 allows connection between the selection terminal 112 and the selection terminal 114, the capacitor C22 allows connection between the selection terminal 113 and the ground, and the capacitor C23 allows connection between the selection terminal 115 and the ground.

Also, with the radio frequency front end circuit 100A according to this embodiment configured as described above, effects similar to those in the second embodiment described above can be achieved.

Furthermore, in the radio frequency front end circuit 100A, the filters 120A, 130A, and 140A are configured as tunable filters. Therefore, the number of filters can be made smaller than the case where filters with fixed frequencies are provided. Thus, a further reduction in size can be achieved.

In this embodiment, as the radio frequency front end circuit 100A, a configuration for reception diversity in which multiple filters (reception filters) are provided at a reception-side signal path has been explained. However, the radio frequency front end circuit is not necessarily configured as described above. The radio frequency front end circuit may have a configuration for transmission diversity in which multiple filters (transmission filters) are provided at a transmission-side signal path.

Other Embodiments

Radio frequency front end circuits according to embodiments of the present invention have been explained above based on the first to third embodiments. However, the present invention is not limited to the embodiments described above. Other embodiments implemented by combining desired component elements in the foregoing embodiments, modifications obtained by various modifications made to the foregoing embodiments conceivable by those skilled in the art without departing from the scope of the present invention, and various types of equipment including a radio frequency front end circuit according to the present invention built therein are also included in the present invention.

For example, the communication apparatus 4 that includes the radio frequency front end circuit described above and the RFIC 3 (RF signal processing circuit) is also included in the present invention. With such a communication apparatus 4, a reduction in size and minimization of loss can be achieved.

Furthermore, in the explanation provided above, as a terminal of a radio frequency front end circuit connected to the common terminal 111 of the switch circuit 10, the ANT terminal 101 connected to the antenna element is explained as an example. However, the terminal of the radio frequency front end circuit connected to the common terminal 111 is not necessarily a terminal connected to the antenna element, and may be an input/output terminal (in this example, an out terminal) connected to a reception amplification circuit such as a low-noise amplifier or an input/output terminal (in this example, an input terminal) connected to a transmission amplification circuit such as a power amplifier. That is, a multiplexer to which multiple filters are common-connected by a switch circuit is also included in the present invention.

Furthermore, for example, a radio frequency front end circuit may have a configuration in which circuits each including the first switch circuit and the first impedance circuit explained above are connected in multiple stages.

Figure 20:
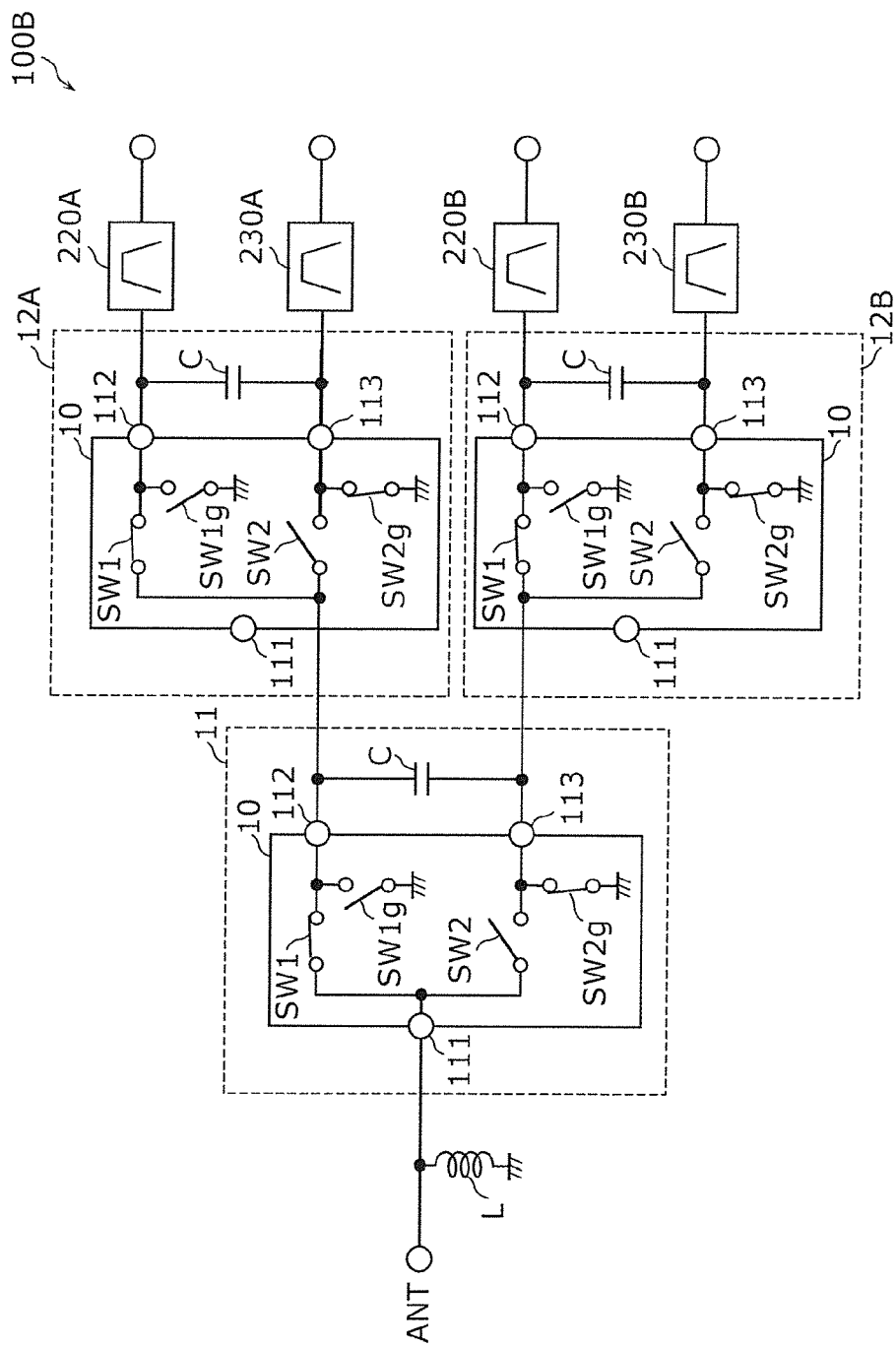
FIG. 20 is a configuration diagram of a first example of a radio frequency front end circuit according to another embodiment.

FIG. 20 is a configuration diagram of a radio frequency front end circuit 100B configured as described above.

The radio frequency front end circuit 100B illustrated in FIG. 20 includes a first-stage circuit 11 and second-stage circuits 12A and 12B, each of the first-stage circuit 11 and the second-stage circuits 12A and 12B including the switch circuit 10 and the capacitor C. The first-stage circuit 11 is located in the first stage where the common terminal 111 is connected to the ANT terminal 101, and each of the second-stage circuits 12A and 12B is located in the second stage where the common terminal 111 is connected to the ANT terminal 101 with the first-stage circuit 11 interposed therebetween.

Specifically, the first-stage circuit 11 includes the switch circuit 10, which is an example of a second switch circuit corresponding to the first switch circuit explained above, and the capacitor C, which is an example of a fourth impedance element corresponding to the first impedance element explained above. The selection terminal 112 that is included in the switch circuit 10 is selectively connected to one of the common terminal 111 and the ground terminal included in the switch circuit 10. Furthermore, the selection terminal 113 that is included in the switch circuit 10 is selectively connected to one of the common terminal 111 and the ground terminal included in the switch circuit 10.

Furthermore, the second-stage circuit 12A includes the switch circuit 10, which is a first switch circuit, and the capacitor C, which is a first impedance element, and is connected to a filter 220A, which is an example of a first filter, and a filter 230A, which is an example of a second filter. Furthermore, the second-stage circuit 12B includes the switch circuit 10, which is a first switch circuit, and the capacitor C, which is a first impedance element, and is connected to a filter 220B, which is another example of the first filter, and a filter 230B, which is another example of the second filter. That is, the radio frequency front end circuit 100B includes a plurality of pairs (in this example, two pairs) each including the first switch circuit, the first filter, the second filter, and the first impedance element.

The common terminal 111 that is included in the switch circuit 10 of the second-stage circuit 12A, which is the first switch circuit in one of the plurality of pairs, is connected to the selection terminal 112 that is included in the switch circuit 10 of the first-stage circuit 11. Furthermore, the common terminal 111 that is included in the switch circuit 10 of the second-stage circuit 12B, which is the first switch circuit in the other one of the plurality of pairs, is connected to the selection terminal 113 that is included in the switch circuit 10 of the first-stage circuit 11.

Furthermore, the capacitor C of the first-stage circuit 11, which is the fourth impedance element, is connected to a node on a path that connects the selection terminal 112 of the first-stage circuit 11 with the common terminal 111 of the second-stage circuit 12A and a node on a path that connects the selection terminal 113 of the first-stage circuit 11 with the common terminal 111 of the second-stage circuit 12B.

With the radio frequency front end circuit 100B configured as described above, four or more frequency bands (in this case, four frequency bands) can be supported while a reduction in size and minimization of loss are achieved.

The number of selection terminals of the first-stage circuit is not necessarily two. Three or more selection terminals may be provided in the first-stage circuit. That is, the radio frequency front end circuit 100B may include there or more pairs each including the first switch circuit, the first filter, the second filter, and the first impedance element. The radio frequency front end circuit 100B configured as described above is able to support more frequency bands.

Furthermore, the first impedance elements of individual pairs are not necessarily the same. The first impedance elements may be different from one another. That is, the element value of the first impedance element of one pair may be different from the element value of the first impedance element of another pair. One first impedance element may be an inductor, while another first impedance element may be a capacitor.

Furthermore, each of main switches and sub-switches has been explained above as individual switches for switching between connection and non-connection according to ON and OFF. However, a main switch and a sub-switch may be configured as a single switch for which a selection terminal of a switch circuit serves as a common terminal and a common terminal and a ground terminal of the switch circuit serve as a selection terminal.

Figure 21:
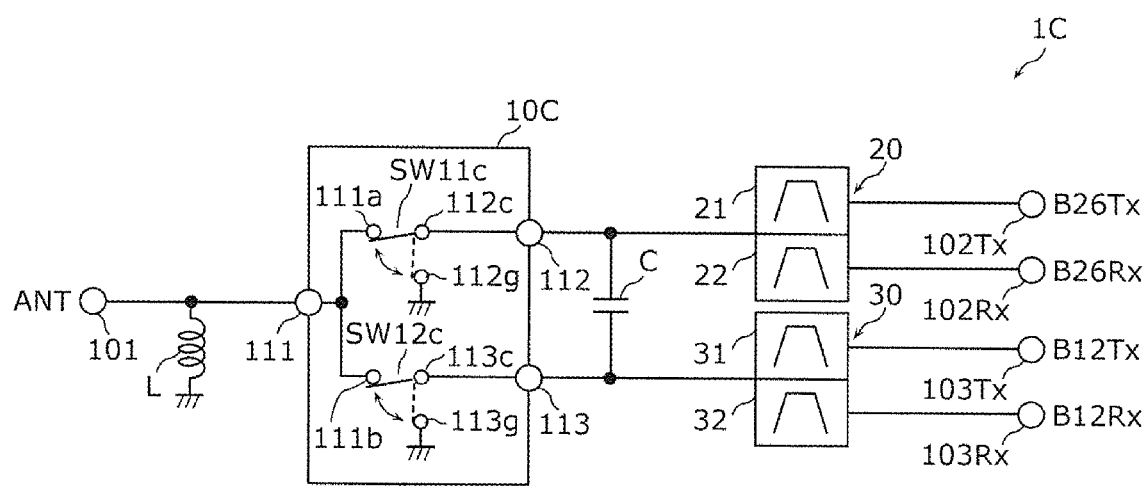
FIG. 21 is a configuration diagram of a second example of the radio frequency front end circuit according to another embodiment.

FIG. 21 is a configuration diagram of a radio frequency front end circuit 1C configured as described above.

A switch circuit 10C illustrated in FIG. 21 is different from the switch circuit 10 according to the first embodiment described above in that, in place of the main switches SW1 and SW2 and the sub-switches SW1g and SW2g, a switch SW11c (first switch) that allows the selection terminal 112 (first selection terminal) to be selectively connected to one of the common terminal 111 and a ground terminal 112g and a switch SW12c (second switch) that allows the selection terminal 113 (second selection terminal) to be selectively connected to one of the common terminal 111 and a ground terminal 113g. Specifically, the switch SW11c includes a common terminal 112c connected to the selection terminal 112, a selection terminal 111a connected to the common terminal 111, and the ground terminal 112g connected to the ground, and allows the common terminal 112c to be selectively connected to one of the selection terminal 111a and the ground terminal 112g. The switch SW12c includes a common terminal 113c connected to the selection terminal 113, a selection terminal 111b connected to the common terminal 111, and a ground terminal 113g connected to the ground, and allows the common terminal 113c to be selectively connected to one of the selection terminal 111b and the ground terminal 113g.

Also, with the radio frequency front end circuit 1C configured as described above, with the provision of the capacitor C1 (first impedance element) that allows connection between the selection terminal 112 (first selection terminal) and the selection terminal 113 (second selection terminal), a reduction in size and minimization of loss can be achieved, as with the radio frequency front end circuits explained above. Furthermore, with the radio frequency front end circuit 1C configured as described above, the number of switches forming the switch circuit 10C can be made smaller than that for the switch circuit 10. Therefore, a reduction in size can be achieved.

Furthermore, for example, a capacitor may be a DTC (Digital Tunable Capacitor), a varactor capacitor to which MEMS is applied, a variable capacitor using BST ($Ba_{1-x}Sr_xTiO_3$: barium strontium titanate), or a varicap. Furthermore, for example, an inductor may be a variable inductor using MEMS.

Accordingly, the accuracy of impedance matching can be increased, and a further minimization of loss can thus be achieved. Furthermore, an impedance matching circuit that matches more impedance states can be configured without increasing the number of impedance elements. Therefore, matching of more filters can be achieved while the size is reduced.

Furthermore, a filter is not necessarily an acoustic wave filter, and may be an LC filter or a dielectric filter. Therefore, impedance characteristics of a filter single unit do not necessarily exhibit capacitive characteristics. Thus, the first impedance element or the third impedance element is not necessarily a capacitor, and may be an inductor. The second impedance element may be a capacitor.

Furthermore, in the case where the impedance of the first filter and the second filter that are tied together includes only a real number component, such as, for example, a case where the impedance of the first filter single unit and the impedance of the second filter single unit have a conjugate relationship, the second impedance element may not be provided.

Furthermore, the standardized impedance is not necessarily 50Ω, and, for example, may be appropriately set according to required specifications or the like for a communication apparatus or the like to which a radio frequency front end circuit is applied.

Furthermore, for example, in a radio frequency front end circuit or a communication apparatus, an inductor by wiring or a transmission line that allows connection between component elements may be included between the component elements.

The present invention is widely usable as a compact, low-loss front end circuit and communication apparatus for communication equipment such as a cellular phone.

1, 1A, 1B, 1C, 100, and 100A: radio frequency front end circuit
2: antenna element
3: RFIC (RF signal processing circuit
4: communication apparatus
10, 10C, and 110: switch circuit
11: first-stage circuit
12A and 12B: second-stage circuit
20, 30, 50, 130, 140, and 150: duplexer
21, 31, and 51: transmission filter
22, 32, and 52: reception filter
40, 120, 120A, 130A, 140A, 150A, 220A, 220B, 230A, and 230B: filter
101: ANT terminal (input/output terminal)
111, 112c, and 113c: common terminal
112 to 115, 111a, and 111b: selection terminal
112g and 113g: ground terminal
180A, 180B, SW11c, and SW12c: switch
190: reception amplification circuit group
C, C1, C11 to C14, and C21: capacitor (first impedance element)
C2, C22, and C23: capacitor (third impedance element)
L: inductor (second impedance element)
SW1, SW2, and SW11 to SW14: main switch
SW1g, SW2g, and SW11g to SW14g: sub-switch

The invention claimed is:

1. A radio frequency front end circuit comprising:
a switch circuit that includes a common terminal connected to an input/output terminal and a plurality of selection terminals selectively connected to the common terminal;
a first filter that is connected to a first selection terminal among the plurality of selection terminals;
a second filter that is connected to a second selection terminal among the plurality of selection terminals, the second filter including a pass band different from a pass band of the first filter; and
a first impedance element,
wherein the switch circuit includes:
a first main switch that switches between a connection state (an ON state) and a non-connection state (an OFF state) between the common terminal and the first selection terminal,
a first sub-switch that switches between a connection state and a non-connection state between the first selection terminal and ground according to an exclusive ON and OFF state relative to the first main switch,
a second main switch that switches between a connection state and a non-connection state between the common terminal and the second selection terminal according to a not restricted ON and OFF state relative to the first main switch, and a second sub-switch that switches between a connection state and a non-connection state between the second selection terminal and the ground according to an exclusive ON and OFF state relative to the second main switch, and wherein the first impedance element is connected to a node on a path that connects the first selection terminal with the first filter and a node on a path that connects the second selection terminal with the second filter.

2. The radio frequency front end circuit according to claim 1, wherein the switch circuit is switched between a first connection form in which only one of the first main switch and the second main switch is ON and a second connection form in which both the first main switch and the second main switch are ON, and wherein the first impedance element causes an impedance of the input/output terminal to match a standardized impedance only in a case where the switch circuit is in the first connection form, out of the first connection form and in the second connection form.

3. The radio frequency front end circuit according to claim 1, further comprising:

a second impedance element that allows connection between the common terminal and the ground, wherein in a case where the switch circuit is in a first connection form in which only one of the first main switch and the second main switch is ON, a parallel circuit including the first impedance element and the second impedance element causes an impedance of the input/output terminal to match a standardized impedance, and wherein in a case where the switch circuit is in a second connection form in which both the first main switch and the second main switch are ON, only the second impedance element, out of the first impedance element and the second impedance element, causes the impedance of the input/output terminal to match the standardized impedance.

4. The radio frequency front end circuit according to claim 3, wherein the first impedance element is a capacitor, and wherein the second impedance element is an inductor.

5. The radio frequency front end circuit according to claim 3, wherein a susceptance component within a pass band of a first filter single unit when viewed from the first selection terminal side is smaller than a susceptance component within a pass band of a second filter single unit when viewed from the second selection terminal side, wherein the radio frequency front end circuit further comprises a third impedance element that allows connection between the first selection terminal and the ground, wherein when the switch circuit is in the first connection form in which only the first main switch is ON, a parallel circuit including the first impedance element, the second impedance element, and the third impedance element causes the impedance of the input/output terminal to match the standardized impedance, wherein when the switch circuit is in the first connection form in which only the second main switch is ON, a parallel circuit including the first impedance element and the second impedance element causes the impedance of the input/output terminal to match the standardized impedance, and wherein when the switch circuit is in the second connection form, a parallel circuit including the second impedance element and the third impedance element causes the impedance of the input/output terminal to match the standardized impedance.

6. The radio frequency front end circuit according to claim 5, wherein the third impedance element is a capacitor, and wherein when the first impedance element is a capacitor, a capacitance value of the third impedance element is smaller than a capacitance value of the first impedance element.

7. The radio frequency front end circuit according to claim 3, wherein a susceptance component within a pass band of a first filter single unit when viewed from the first selection terminal side is smaller than a susceptance component within a pass band of a second filter single unit when viewed from the second selection terminal side, and wherein an off capacitance of the first sub-switch is larger than an off capacitance of the second sub-switch.

8. The radio frequency front end circuit according to claim 3, wherein at least one of the first filter and the second filter includes multiple filters, and wherein the multiple filters configure a multiplexer in which one of terminals of the multiple filters are common-connected and connected to the switch circuit.

9. The radio frequency front end circuit according to claim 1, wherein each of the first filter and the second filter is an acoustic wave filter including an acoustic wave resonator.

10. The radio frequency front end circuit according to claim 9, wherein the switch circuit is switched between a first connection form in which only one of the first main switch and the second main switch is ON and a second connection form in which both the first main switch and the second main switch are ON, and wherein the radio frequency front end circuit further comprises a controller that causes the switch circuit to enter the second connection form in a case where carrier aggregation is performed in which transmission or reception of a first frequency band allocated to a pass band of the first filter and a second frequency band allocated to a pass band of the second filter is performed at the same time and causes the switch circuit to enter the first connection form in a case where non-carrier aggregation is performed in which transmission or reception of only one of the first frequency band and the second frequency band is performed.

11. The radio frequency front end circuit according to claim 9, further comprising:

a plurality of pairs each including a first switch circuit as the switch circuit, the first filter, the second filter, and the first impedance element;

a second switch circuit that includes a common terminal, a first selection terminal, and a second selection terminal; and a fourth impedance element, wherein the first selection terminal included in the second switch circuit is selectively connected to one of the common terminal and a ground terminal included in the second switch circuit, wherein the second selection terminal included in the second switch circuit is selectively connected to one of the common terminal and the ground terminal included in the second switch circuit, wherein the common terminal included in the first switch circuit in a first pair out of the plurality of pairs is connected to the first selection terminal included in the second switch circuit, wherein the common terminal included in the first switch circuit in a second pair out of the plurality of pairs is connected to the second selection terminal included in the second switch circuit, and wherein the fourth impedance element is connected to a node on a path that connects the first selection terminal included in the second switch circuit with the common terminal included in the first switch circuit in the first pair and a node on a path that connects the second selection terminal included in the second switch circuit with the common terminal included in the first switch circuit in the second pair.

12. A communication apparatus comprising:
an RF signal processing circuit that processes a radio frequency signal transmitted and received at an antenna element; and
the radio frequency front end circuit according to claim 9 that transmits the radio frequency signal between the antenna element and the RF signal processing circuit.

13. The radio frequency front end circuit according to claim 1,
wherein a susceptance component within a pass band of a first filter single unit when viewed from the first selection terminal side and a susceptance component within a pass band of a second filter single unit when viewed from the second selection terminal side are equivalent to each other.

14. The radio frequency front end circuit according to claim 1,
wherein at least one of the first filter and the second filter includes multiple filters, and
wherein the multiple filters configure a multiplexer in which one of terminals of the multiple filters are common-connected and connected to the switch circuit.

15. The radio frequency front end circuit according to claim 1,
wherein the switch circuit is switched between a first connection form in which only one of the first main switch and the second main switch is ON and a second connection form in which both the first main switch and the second main switch are ON, and
wherein the radio frequency front end circuit further comprises a controller that causes the switch circuit to enter the second connection form in a case where carrier aggregation is performed in which transmission or reception of a first frequency band allocated to a pass band of the first filter and a second frequency band allocated to a pass band of the second filter is performed at the same time and causes the switch circuit to enter the first connection form in a case where non-carrier aggregation is performed in which transmission or reception of only one of the first frequency band and the second frequency band is performed.

16. The radio frequency front end circuit according to claim 1, further comprising:

a plurality of pairs each including a first switch circuit as the switch circuit, the first filter, the second filter, and the first impedance element;
a second switch circuit that includes a common terminal, a first selection terminal, and a second selection terminal; and
a fourth impedance element,
wherein the first selection terminal included in the second switch circuit is selectively connected to one of the common terminal and a ground terminal included in the second switch circuit,
wherein the second selection terminal included in the second switch circuit is selectively connected to one of the common terminal and the ground terminal included in the second switch circuit,
wherein the common terminal included in the first switch circuit in a first pair out of the plurality of pairs is connected to the first selection terminal included in the second switch circuit,
wherein the common terminal included in the first switch circuit in a second pair out of the plurality of pairs is connected to the second selection terminal included in the second switch circuit, and
wherein the fourth impedance element is connected to a node on a path that connects the first selection terminal included in the second switch circuit with the common terminal included in the first switch circuit in the first pair and a node on a path that connects the second selection terminal included in the second switch circuit with the common terminal included in the first switch circuit in the second pair.

17. A communication apparatus comprising:
an RF signal processing circuit that processes a radio frequency signal transmitted and received at an antenna element; and
the radio frequency front end circuit according to claim 1 that transmits the radio frequency signal between the antenna element and the RF signal processing circuit.

18. The radio frequency front end circuit according to claim 1, wherein:
the exclusive ON and OFF state of the first sub-switch relative to the first main switch is a state in which the first sub-switch is OFF when the first main switch is ON, and the first sub-switch is ON when the first main switch is OFF, and
the exclusive ON and OFF state of the second sub-switch relative to the second main switch is a state in which the second sub-switch is OFF when the second main switch is ON, and the second sub-switch is ON when the second main switch is OFF.

19. The radio frequency front end circuit according to claim 1,
wherein the not restricted ON and OFF state of the second main switch relative to the first main switch is a state in which the second main switch is ON or OFF regardless of whether the first main switch is ON or OFF.

20. A radio frequency front end circuit comprising:
a switch circuit that includes a common terminal connected to an input/output terminal and a plurality of selection terminals selectively connected to the common terminal;
a first filter that is connected to a first selection terminal among the plurality of selection terminals;
a second filter that is connected to a second selection terminal among the plurality of selection terminals; and
a first impedance element,
wherein the switch circuit includes:

a first switch configured to selectively connect the first selection terminal to one of the common terminal and a ground terminal, and a second switch configured to selectively connect the second selection terminal to one of the common terminal and the ground terminal, and wherein the first impedance element is connected to a first node on a path that connects the first selection terminal with the first filter and a second node on a path that connects the second selection terminal with the second filter.

* * * * *

UNITED STATES PATENT AND TRADEMARK OFFICE
CERTIFICATE OF CORRECTION

PATENT NO. : 10,686,421 B2
APPLICATION NO. : 16/356322
DATED : June 16, 2020
INVENTOR(S) : Koji Nosaka It is certified that error appears in the above-identified patent and that said Letters Patent is hereby corrected as shown below:

In the Specification

Column 8, Line 52, "sub-switch Swig" should read -- sub-switch Sw1g --

Column 9, Line 31, "sub-switch Swig that" should read -- sub-switch Sw1g that --

Column 9, Line 36, "sub-switches Swig and" should read -- sub-switches Sw1g and --

Column 9, Line 54, "sub-switches Swig" should read -- sub-switches Sw1g --

Column 9, Line 58, "Swig and SW2g" should read -- Sw1g and SW2g --

Column 9, Line 60, "sub-switches Swig and" should read -- sub-switches Sw1g and --

Column 12, Line 67, "switches Swig and" should read -- switches Sw1g and --

Column 18, Line 49, "sub-switch Swig is OFF" should read -- sub-switch Sw1g is OFF --

Column 19, Line 3, "sub-switch Swig in ON" should read -- sub-switch Sw1g is ON --

Column 19, Line 46, "sub-switch Swig" should read -- sub-switch Sw1g --

Column 22, Line 67, "sub-switch Swig associated" should read -- sub-switch Sw1g associated --

Column 25, Line 30, "switch Swig is larger" should read -- switch Sw1g is larger --

Column 25, Line 34, "Swig, the capacitance" should read -- Sw1g, the capacitance --

Signed and Sealed this
First Day of December, 2020

Andrei Iancu
*Director of the United States Patent and Trademark Office*